United States Patent
Sato et al.

(10) Patent No.: US 6,601,947 B1
(45) Date of Patent: Aug. 5, 2003

(54) NARROW-PITCH CONNECTOR, ELECTROSTATIC ACTUATOR, PIEZOELECTRIC ACTUATOR, INK-JET HEAD, INK-JET PRINTER, MICROMACHINE, LIQUID CRYSTAL PANEL, AND ELECTRONIC APPARATUS

(75) Inventors: Eiichi Sato, Suwa (JP); Masahiro Fujii, Suwa (JP); Hiroshi Koeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/701,345
(22) PCT Filed: Mar. 31, 2000
(86) PCT No.: PCT/JP00/02071
§ 371 (c)(1),
(2), (4) Date: Dec. 13, 2000
(87) PCT Pub. No.: WO00/58205
PCT Pub. Date: Oct. 5, 2000

(30) Foreign Application Priority Data

Mar. 31, 1999 (JP) .................................. 11-094072

(51) Int. Cl.⁷ .............................................. B41J 2/045
(52) U.S. Cl. ........................................................ 347/68
(58) Field of Search ........................... 347/50, 54, 68, 347/69; 439/77

(56) References Cited

U.S. PATENT DOCUMENTS 4,871,319 A * 10/1989 Babow .................... 439/77
5,120,591 A    6/1992 Tomita .................... 428/138

FOREIGN PATENT DOCUMENTS

| EP | 0 460 668 A2 | 6/1991 |
| EP | 0 8610 279 A1 | 2/1998 |
| JP | 57158824 A * | 9/1982 ............ G02B/7/26 |
| JP | 59-8384 | 1/1984 |
| JP | 4-40277 | 9/1992 |
| JP | 5-174890 | 7/1993 |
| JP | 6-333652 | 12/1994 |
| JP | 10-193596 | 7/1998 |

* cited by examiner

*Primary Examiner*—Anh T. N. Vo
(74) *Attorney, Agent, or Firm*—Oliff & Berridge, PLC

(57) ABSTRACT

The invention provides a narrow pitch connector which is capable of coping with fine pitches between electrodes, an electrostatic actuator, a piezoelectric actuator, a micro machine and a liquid crystal panel each including the narrow pitch connector, an ink jet head using the electrostatic actuator or the piezoelectric actuator, and an ink jet printer and an electronic appliance which are incorporated with the ink jet head. A narrow pitch connector includes a substrate on which a plurality of first terminal electrodes, a plurality of second terminal electrodes, and wires electrically connecting the first terminal electrodes with the second terminal electrodes having a function of making conversion from a pitch of the first terminal electrodes to a pitch of the second terminal electrodes are formed. Grooves are formed between the first terminal electrodes respectively.

18 Claims, 25 Drawing Sheets

(A)

(B)

(a)

(b)

(d)

(e)

(f)

(A)

(b)

(A)

(B)

NARROW-PITCH CONNECTOR, ELECTROSTATIC ACTUATOR, PIEZOELECTRIC ACTUATOR, INK-JET HEAD, INK-JET PRINTER, MICROMACHINE, LIQUID CRYSTAL PANEL, AND ELECTRONIC APPARATUS

TECHNICAL FIELD

The present invention relates to a connector for a narrow pitch and also to an electrostatic actuator, a piezoelectric actuator, a micro machine, a liquid crystal panel, an ink jet head using these electrostatic actuator and piezoelectric actuator, an ink jet printer mounted with these ink jet heads, and an electronic appliance, each of which includes the connector for a narrow pitch.

BACKGROUND ART

In the recent years, electronic appliances have been configured acceleratedly more compact and lighter in weight. Along with this compact configuration of the electronic appliances, there have been stronger demands for parts to be used for the electronic appliances which are configured more compact and manufactured at lower costs. A micro working technology referred to as micro machining has been developed to cope with these demands and micro machines which are compact and have advanced functions have been manufactured. As an example of the micro machines, there is a printer head (hereinafter referred to as a printer engine) which has a built-in piezoelectric element and ejects ink by oscillating the built-in piezoelectric element.

An LCD cell of a liquid crystal panel is another example of part for which compact configuration is demanded.

To connect such a compact part to an external substrate, there as been used, for example, a method which interposes a connector composed of a flexible substrate, a method which uses wire bonding or a method which solders a wire cable.

FIG. 28 is an enlarged view showing main parts of a connection object and a connector composed of a flexible substrate. On a surface of a connection object 1 such as a printer engine an LCD cell of a liquid crystal panel, a plurality of wires 2 connected to an element are arranged and terminal electrodes 3 are formed at an end as shown in FIG. 28.

Used as a connector 4 which connects the connection object 1 to an external substrate is a flexible substrate which is made of a material of polyimide. Terminal electrodes 5 which can be overlapped with the terminal electrodes 3 formed at the end of connection object 1 are formed at an end of the substrate and terminal electrodes 6 which have a width greater than that of the terminal electrodes 5 are formed at a wider pitch at an end on a side opposite to the side at which the terminal electrodes 5 are formed. Wires 6A are arranged to connect the terminal electrodes 5 to the terminal electrodes 6, and the width and the pitch are changed in the course of the wires 6A.

FIG. 29 is a diagram descriptive of procedures for connecting the connection object 1 to the connector 4 and FIG. 30 is a sectional view taken along a C—C line in FIG. 29.

In a case where the above described connection object 1 is to be connected to the connector 4 as shown in FIGS. 29 and 30, the connection object 1 is first placed on a bonding stage 7 so that the terminal electrodes 3 are set upside. Then, the terminal electrodes 5 arranged on the connector 4 are positioned to the terminal electrodes 3 and these terminals are overlapped with each other. An adhesive containing electrically conductive particles is applied between the terminal electrodes 3 and the terminal electrodes 5 so that the electrodes are electrically conductive by way of the electrically conductive particles.

A bonding tool 8 which can be raised and lowered is disposed over the overlapped electrodes, that is, over the terminal electrodes 5 of the connector 4. A heater 9 is built in the bonding tool 8 so that a tip of the bonding tool 8 can be heated by operating the heater 9.

At a bonding step, the electrodes are connected by lowering the bonding tool 8 and pressing the connector 4 with the bonding tool 8 so as to bring the electrically conductive particles into close contact with the electrodes and shorten a drying time of the adhesive by heating.

However, it is conventionally necessary to arrange connecting terminals on a micro machine or the like at a pitch which permits connection to a flexible substrate or the like since the flexible substrate is used for connecting the micro machine or the like to an external substrate. The pitch which permits connection to the flexible substrate is usually on the order of 100 $\mu$M. The inventor has made various examinations and confirmed that a limit of a wiring pitch lies in the vicinity of 60 $\mu$m for conventional connectors made of polyimide.

Accordingly, a terminal portion must be configured large only for enabling connection to the flexible substrate though actuators can be configured compact by the micro machining technology. As a result, there is posed a problem that the large terminal portion reduces a number of micro machines which can be cut out from a single silicon wafer.

Since manufacturing of the micro machines requires not only precise working typically represented by anisotropic etching of a silicon wafer but also expensive materials and expensive machines in particular, there has been desired to configure connecting terminals so as to occupy an area as small as possible, thereby manufacturing a large number of micro machines from a single silicon wafer with a high efficiency.

Furthermore, there is another problem that a trouble such as enhancement of a resistance value between terminals, improper joining or short circuit between adjacent terminals may be caused due to a difference between an coefficient of thermal expansion of a material (mainly silicon) of the connection object 1 and that of a material (mainly polyimide) of the connector 4.

This point will be described below in detail.

When the bonding tool 8 is brought near for connecting the connection object 1 to the connector 4, the connection object 1 and the connector 4 start swelling under an influence due to the heater 9 built in the bonding tool 8.

Since polyimide has a coefficient of thermal expansion which is larger than that of silicon at this time, the connector 4 swells larger than the connection object 1, thereby deviating the terminal electrodes 5 from the terminal electrodes 3 as shown in FIG. 31. Since the connection object 1 such as the printer engine or the LCD cell of liquid crystal panel is configured finer year by year and a pitch 10 between the electrode terminals 3 is narrowed to cope with the finer connection object (refer to FIG. 30), the trouble such as the enhancement of a resistance value between the terminals, improper joining or short circuit between adjacent terminals may be caused even when positions of the terminal electrodes are slightly deviated.

When the terminal electrodes are arranged at a narrower pitch and are thinner, a space reserved between adjacent terminal electrodes are smaller, thereby producing a fear that short circuit may be caused between the adjacent terminal electrodes.

DISCLOSURE OF THE INVENTION

The present invention relates to a narrow pitch connector which is capable of coping with fine pitches between electrodes, an electrostatic actuator, a piezoelectric actuator, a micro machine and a liquid crystal panel which include the narrow pitch connector, an ink jet head which uses the electrostatic actuator or the piezoelectric actuator, and an ink jet printer and an electronic appliance on which the ink jet heads are mounted.

(1) A narrow pitch connector in a mode of the present invention is a connector which comprises a plurality of first terminal electrodes and second terminal electrodes which are formed on a substrate, and wires which electrically connect the first terminal electrodes with the second terminal electrodes: the above described wires having a function of making conversion from a pitch of the first terminal electrodes to a pitch of the second terminal electrodes, wherein grooves are formed between the first terminal electrodes respectively.

By forming the grooves between the first terminal electrodes, the present invention makes it possible to prevent the terminal electrodes from being deformed by heat and pressure or shorted by outflow of an alloy or a metal at a step of an alloy bonding or a metal bonding even if the electrodes have a narrow pitch. Furthermore, the present invention makes it possible to lengthen a creeping distance between the adjacent terminal electrodes, thereby suppressing an influence due to noise.

(2) A narrow pitch connector in another mode of the present invention is the connector described in (1) above, wherein an insulating film is formed in the grooves.

By forming the insulating film in the grooves, the present invention makes it possible to prevent the first terminal electrodes from being electrically conductive to the substrate without fail.

(3) A narrow pitch connector in another mode of the present invention is the connector described in (2) above, wherein metal wires are formed on the insulating film formed in the grooves.

By arranging the metal wires on the bottom of the grooves, the present invention makes it possible to enhance a bonding strength between a connection object and the connector bonded with an adhesive. By enhancing the bonding strength, a connection with high humidity resistance can be realized.

(4) A narrow pitch connector in another mode of the present invention is the connector described in (3) above, wherein the metal wires are connected to the substrate, and a ground wiring portion or a power supply wiring portion.

Accordingly, a crystalline substrate can be set at a potential equal to that of the ground wiring portion or the power supply wiring portion, thereby stabilizing the potential of the crystalline substrate.

Furthermore, the narrow pitch connector is capable of preventing an erroneous operation of an element caused by line noise in a fine wiring portion and reducing radiation noise owing to an electrostatic shielding function.

(5) A narrow pitch connector in another mode of the present invention is the connector described in any one of (1) through (4) above, wherein the first terminal electrodes are electrodes to be electrically connected to external terminal electrodes formed on a connection object and the grooves are formed to reserve an adhesive for connecting the first terminal electrodes with the external terminal electrodes.

Accordingly, an excessive amount of the adhesive is accommodated into the grooves when joints are brought into close contact with the terminal electrodes and the electrically conductive particles contained in the adhesive are not caught at a location other than the terminal electrodes, so that outbreak of a short circuit between the adjacent terminal electrodes can be prevented.

(6) A narrow pitch connector in another mode of the present invention is the connector described in (5) above, wherein a depth of the grooves is set not shallower than three times a particle diameter of electrically conductive particles contained in the adhesive.

Accordingly, the narrow pitch connector is capable of accommodating the electrically conductive particles with a margin and enhancing a safety factor for prevention of short circuits. Furthermore, the connector is capable of enlarging a contact area and enhancing bonding strength since it allows the adhesive containing the electrically conductive particles to be reserved in the grooves.

(7) A narrow pitch connector in another mode of the present invention is the connector described in any one of (1) through (6) above, wherein the grooves are set longer than an overlapped portion of the terminal electrodes.

When the grooves have such a length, a portion enclosed by the connection object and the narrow pitch connector does not form a closed space at a bonding step, thereby hardly involves air, so that an adverse influence caused by air bubbles is not produced.

Furthermore, since excessive adhesive can be extruded without fail, thereby an internal pressure does not remain in the joints so that an adverse influence caused by the internal pressure is not produced.

(8) A narrow pitch connector in another mode of the present invention is the connector described in (5) above, wherein the connector is characteristic in that a coefficient of thermal expansion of the substrate is nearly equal to or smaller than that of the connection object.

Since the coefficient of thermal expansion of the substrate is nearly equal to that of the connection object as described above, a deviation of a relative position between the terminal electrodes to be connected each other is minimized at a step of bonding by pressing and heating.

When the coefficient of thermal expansion of the substrate is smaller than that of the connection object, a similar effect can be obtained by setting a main body of the connector at a temperature higher than the connection object and bonding them. (9) A narrow pitch connector in another mode of the present invention is the connector described in any one of (1) through (8) above, wherein the substrate is made of single-crystal silicon.

When the above described substrate is made of single-crystal silicon, the substrate is capable of enhancing a heat radiation effect and preventing a resistance value from increasing due to a temperature rise.

(10) A narrow pitch connector in another mode of the present invention is the connector described in (9) above, characterized in that a crystal face of the single-crystal silicon is a (100) face.

When the crystal face of the single-crystal silicon is the (100) face, a V-shaped groove can be formed at an angle of 54.74 degrees relative to the face by anisotropically etching the face. In addition, a depth of the V-shaped groove can be accurately controlled dependently on a width of a window (made, for example, of an SiO$_2$ film) set on the (100) face.

(11) A narrow pitch connector in still another mode of the present invention is the connector described in (9) above, characterized in that the crystal face of the single-crystal silicon is a (110) face.

When the crystal face of the single-crystal silicon is the (110) face, a groove having a rectangular sectional shape can be formed by anisotropically etching the face. In this case, the groove can be formed at a predetermined depth independently of a width of the groove.

(12) A micro machine in another mode of the present invention comprises a moving mechanism portion and a first substrate on which a plurality of first terminal electrodes are formed, and is characterized in that the micro-machine further comprises a second substrate on which second terminal electrodes are formed to be electrically connected to the plurality of first terminal electrodes, a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the second terminal electrodes respectively.

(13) A piezoelectric actuator in another mode of the present invention comprises a piezoelectric element and a first substrate on which a plurality of first terminal electrodes are formed, and is characterized in that the actuator further comprises a second substrate on which second terminal electrodes are formed to be electrically connected to the first terminal electrodes, and a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the second terminal electrodes respectively.

(14) An electrostatic actuator in another mode of the present invention comprises an electrostatic oscillator and a first substrate on which a plurality of first terminal electrodes are formed, and is characterized in that the actuator further comprises a second substrate on which second terminal electrodes are formed to be electrically connected to the plurality of first terminal electrodes, a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the second terminal electrodes respectively.

(15) An ink jet head in another mode of the present invention comprises a piezoelectric element and a first substrate on which a plurality of first terminal electrodes are formed for ejecting an ink drop with the piezoelectric element, and is characterized in that the ink jet head further comprises a second substrate on which second terminal electrodes are formed to be electrically connected to the plurality of first terminal electrodes, a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the above described second terminal electrodes respectively.

(16) An ink jet head in another mode of the present invention comprises an electrostatic oscillator and a first substrate on which a plurality of first terminal electrodes are formed for ejecting an ink drop with the electrostatic oscillator, and is characterized in that the ink jet head further comprises a second substrate on which second terminal electrodes are formed to be electrically connected to the plurality of first terminal electrodes, a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the second terminal electrodes respectively.

(17) An ink jet printer in another mode of the present invention comprises an ink jet head having a first substrate on which a piezoelectric element and a plurality of first terminal electrodes are formed, and is characterized in that the ink jet head further comprises a second substrate on which second terminal electrodes are formed to be electrically connected to the plurality of first terminal electrodes, a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the above described second terminal electrodes respectively.

(18) An ink jet printer in another mode of the present invention comprises an ink jet head having an electrostatic oscillator and a first substrate on which a plurality of first terminal electrodes are formed, and is characterized in that the ink jet head further comprises a second substrate on which second terminal electrodes are formed to be electrically connected to the plurality of first terminal electrodes, a plurality of third terminal electrodes and wires for electrically connecting the second terminal electrodes with the third terminal electrodes are formed on the second substrate, the wires have a function of making conversion from a pitch of the second terminal electrodes to a pitch of the third terminal electrodes, and grooves are formed between the second terminal electrodes respectively.

By forming the grooves between the second terminal electrodes on the second substrate, each of inventions set forth in (14) through (18) described above makes it possible to prevent the terminal electrodes from being deformed by heat and pressure or shorted by outflow of an alloy or a metal at a step of an alloy bonding or a metal bonding even if the electrodes have a narrow pitch. Furthermore, the invention makes it possible to lengthen a creeping distance between adjacent terminal electrodes, thereby suppressing an influence due to noise.

As a result, the invention allows the terminal electrodes to be configured compact on the first substrate, thereby making it possible to manufacture the large number of first substrates from a single semiconductor wafer and enhance productivity, for example, when the first substrate is manufactured from a single semiconductor wafer.

(19) A liquid crystal device in another mode of the present invention comprises a liquid crystal sandwiched between a first substrate and a second substrate, a plurality of first terminal electrodes which are formed on either of the first substrate and the second substrate, and is characterized in that the liquid crystal device further comprises a third substrate on which second terminal electrodes are formed to be electrically connected to the first terminal electrodes, a plurality of third terminal electrodes and wires for electrically connecting the second terminal electrodes with the third terminal electrodes are formed on the third substrate, the wires have a function of making conversion from a pitch of the second terminal electrodes to a pitch of the above described third terminal electrodes, and grooves are formed between the above described second terminal electrodes respectively.

(20) An electronic appliance in another mode of the present invention comprises a liquid crystal device, and is characterized in that the liquid crystal device comprises a first substrate, a second substrate, a liquid crystal sandwiched between the first substrate and the second substrate, and a plurality of first terminal electrodes formed on either of the first substrate and the second substrate, the liquid crystal device further comprises a third substrate on which second terminal electrodes are formed to be electrically connected to the plurality of first terminal electrodes, a plurality of third terminal electrodes and wires for electrically connecting the second terminal electrodes with the third terminal electrodes are formed on the third substrate, the wires have a function of making conversion from a pitch of the second terminal electrodes to a pitch of the third terminal electrodes, and grooves are formed between the second terminal electrodes respectively.

By forming the grooves between the second terminal electrodes on the third substrate, an invention set forth in (19) or (20) described above makes it possible to prevent the terminal electrodes from being deformed by heat and pressure or shorted by outflow of an alloy or a metal at a step of an alloy bonding or a metal bonding even if the electrodes have a narrow pitch. Furthermore, the invention makes it possible to lengthen a creeping distance between adjacent terminal electrodes, thereby suppressing an influence due to noise.

As a result, an area to be occupied by a terminal electrode section of the first substrate or the second substrate can be minimized. Therefore, a large display section can be reserved even if the substrate has an area equal to that of a conventional substrate. Furthermore, the terminal electrodes can be connected with a narrow pitch, so that the number of terminals in a connecting section can be increased. Accordingly, pitches of wires and pixels can be narrow and highly minute.

BRIEFLY DESCRIBE OF THE DRAWINGS

FIG. 1 is a front view showing a connector for a narrow pitch preferred as a first embodiment of the present invention and a terminal portion of a connection object to which the connector is to be connected;

FIGS. 2(A) and 2(B) are enlarged side views of an edge of the connector for a narrow pitch preferred as the first embodiment of the present invention;

Figure 5:
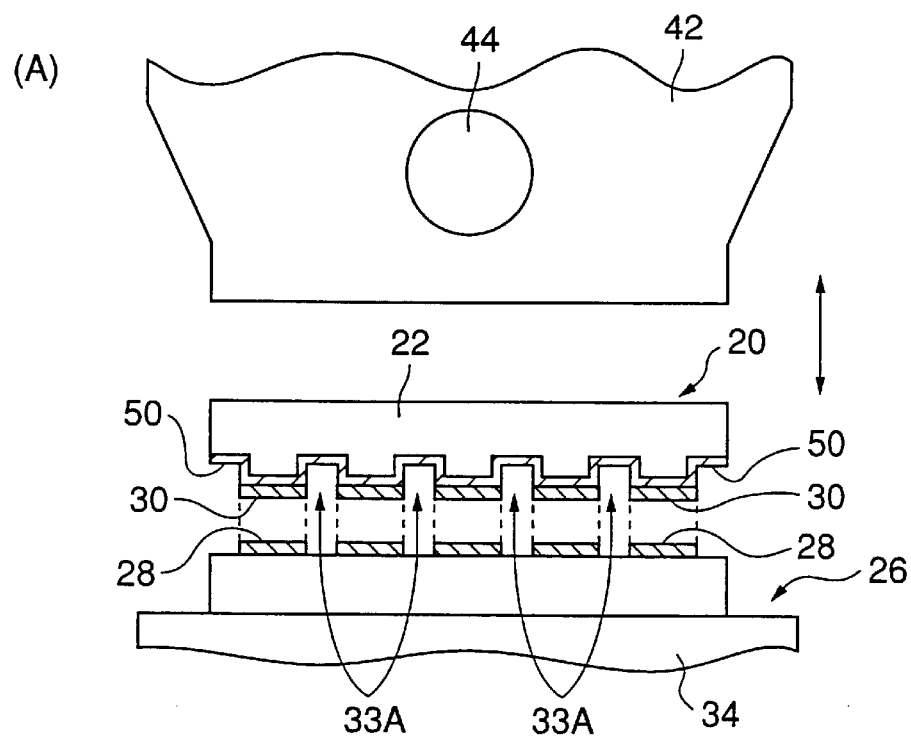
Figure 5:
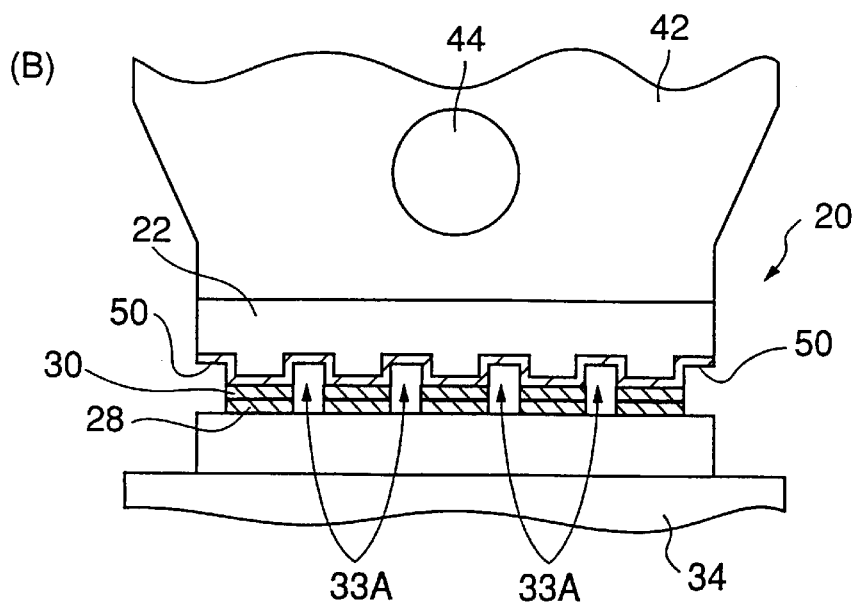
Figure 6:
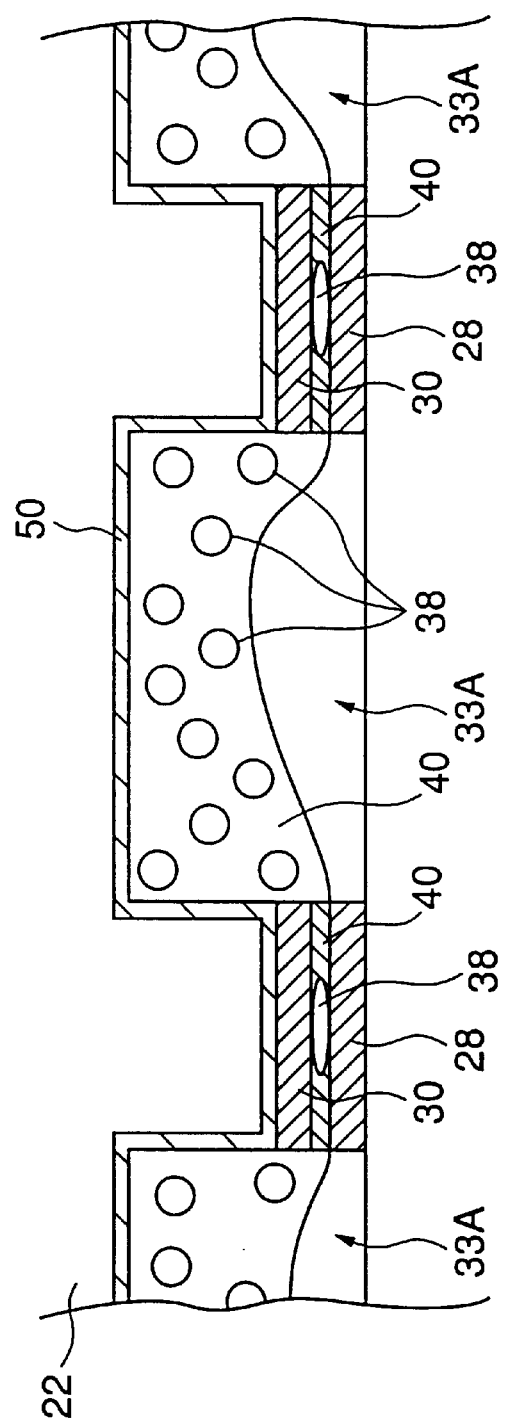
Figure 9:
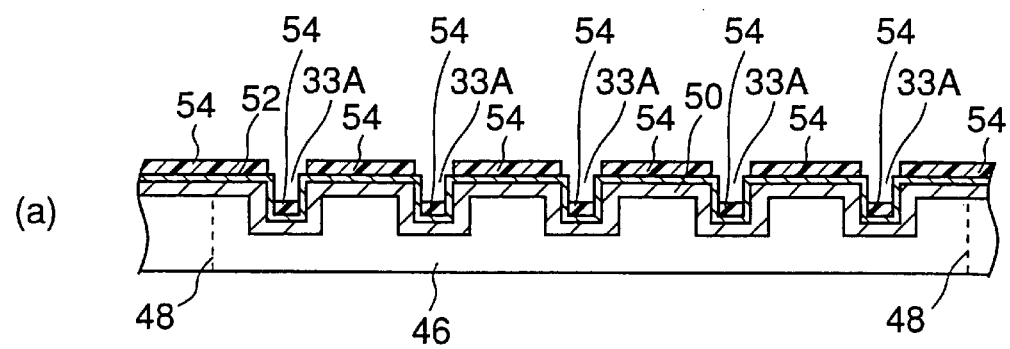
Figure 9:
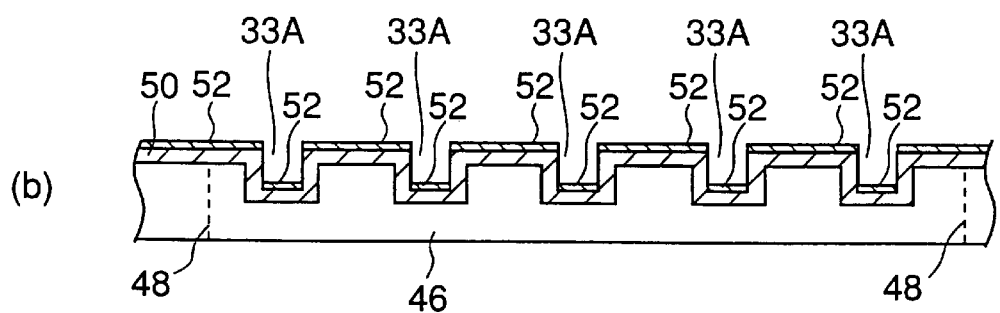
Figure 11:
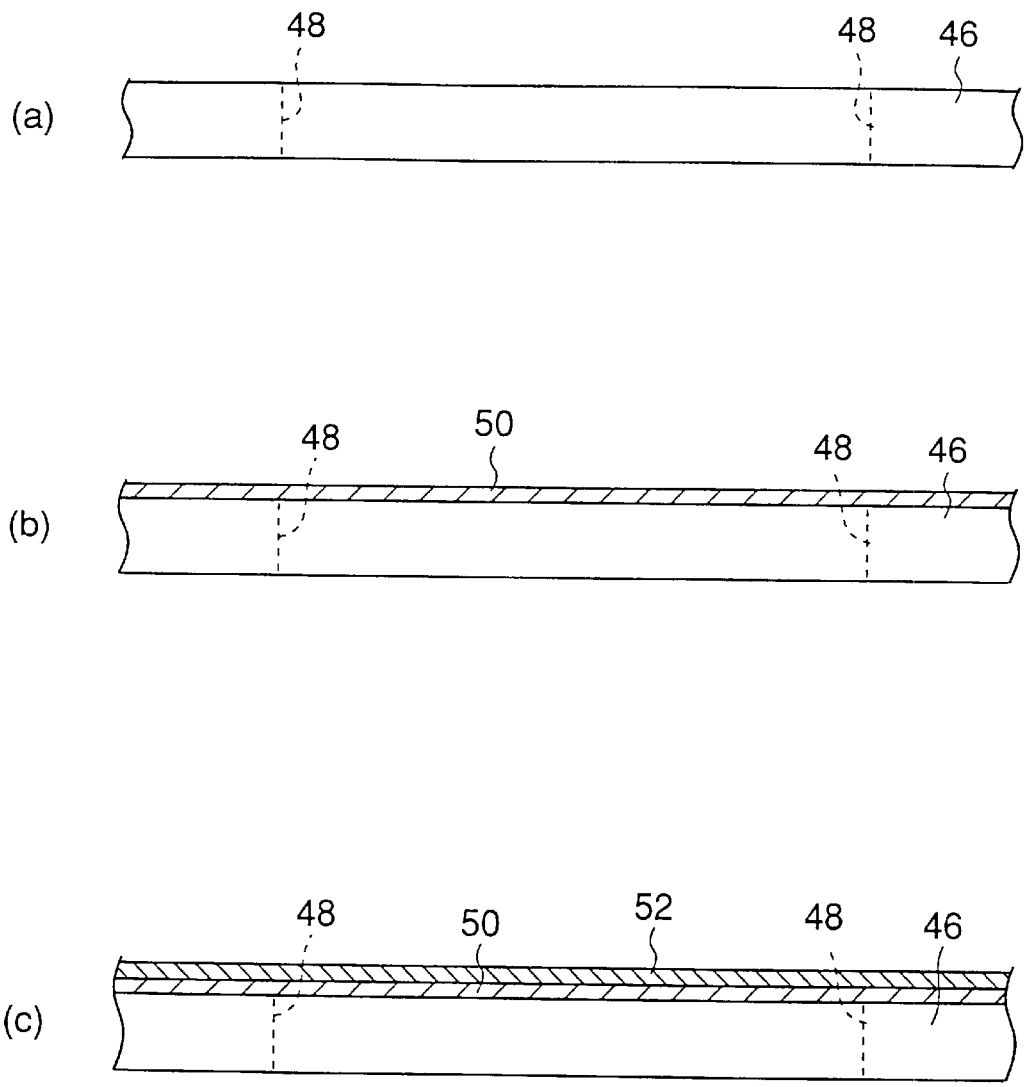
Figure 12:
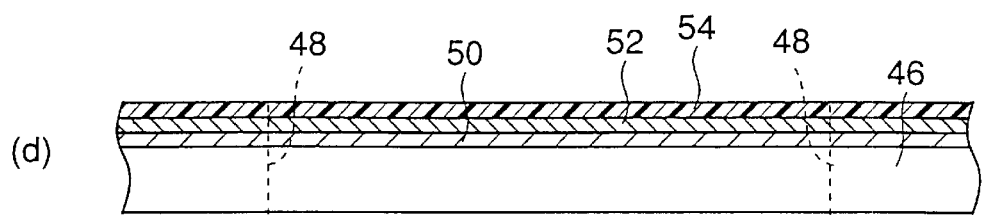
Figure 12:
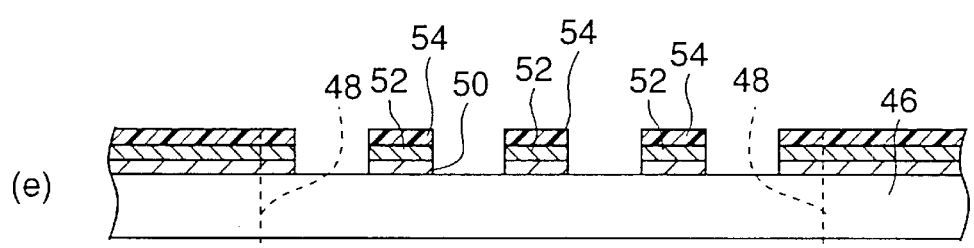
Figure 12:
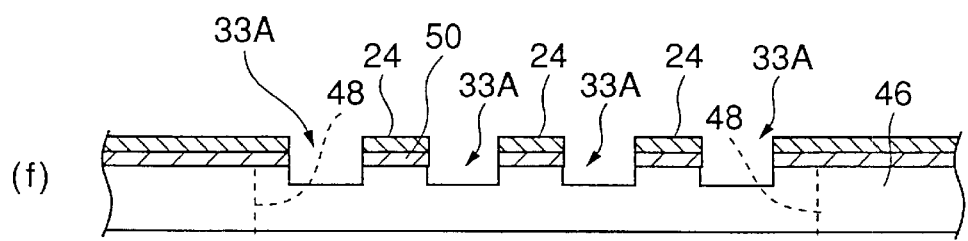
Figure 13:
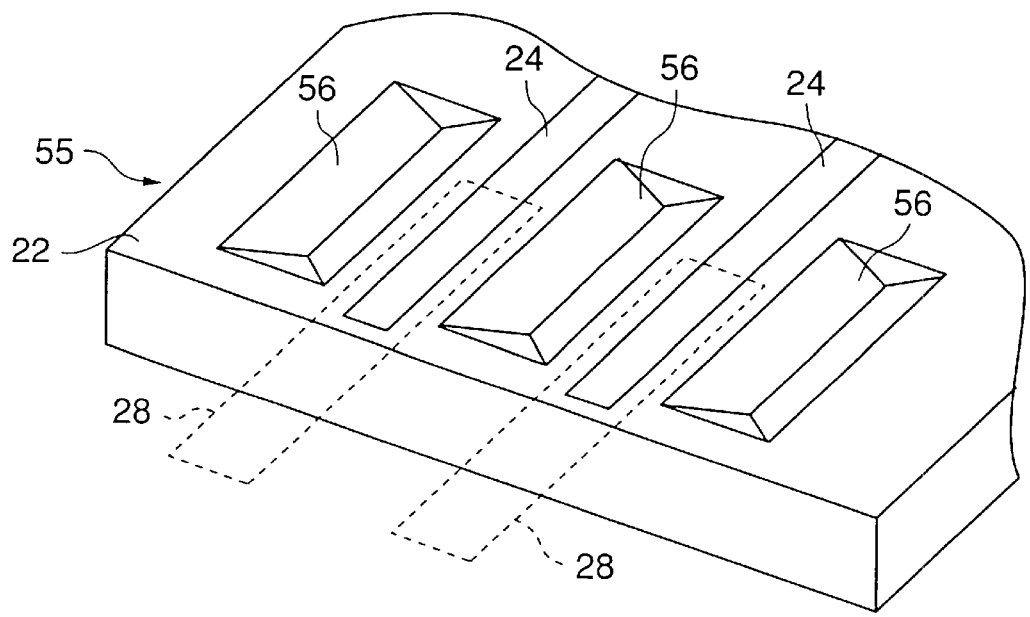
Figure 14:
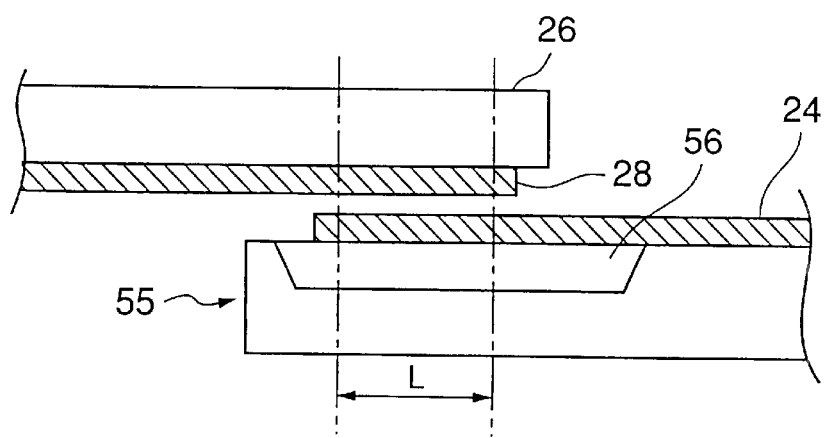
Figure 15:
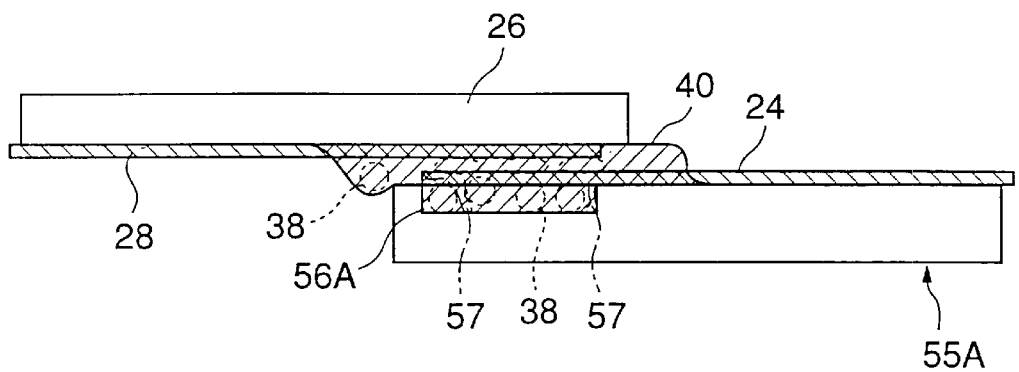
Figure 16:
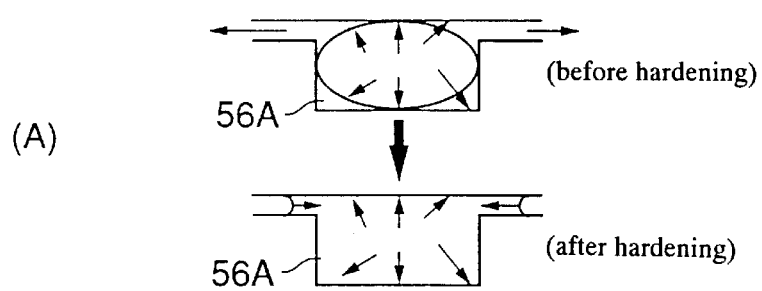
Figure 16:
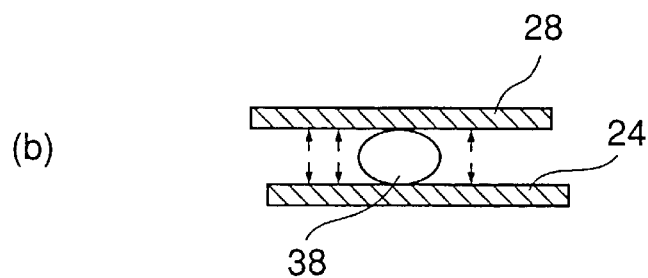
Figure 17:
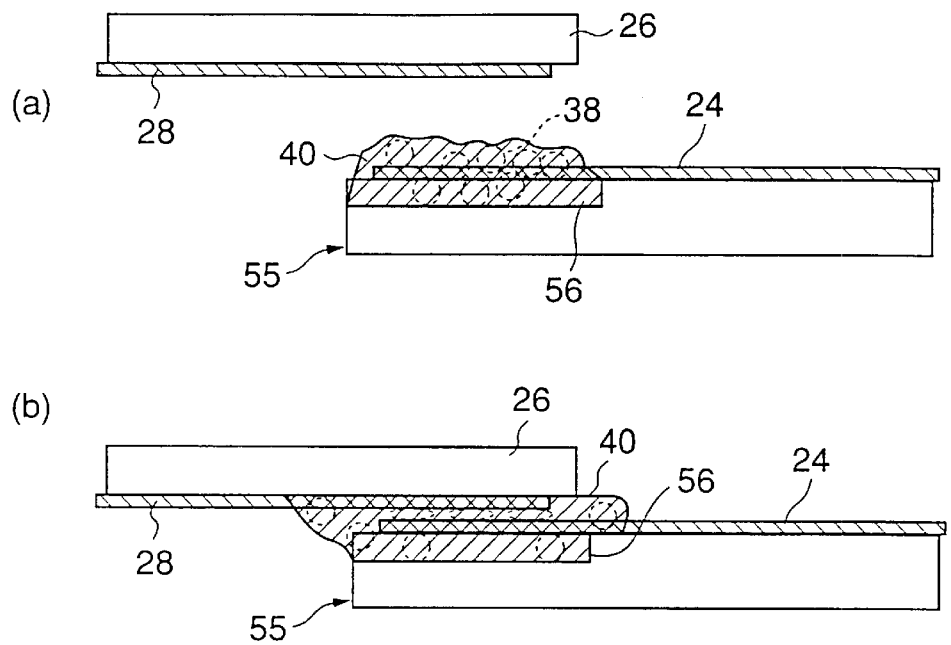
Figure 18:
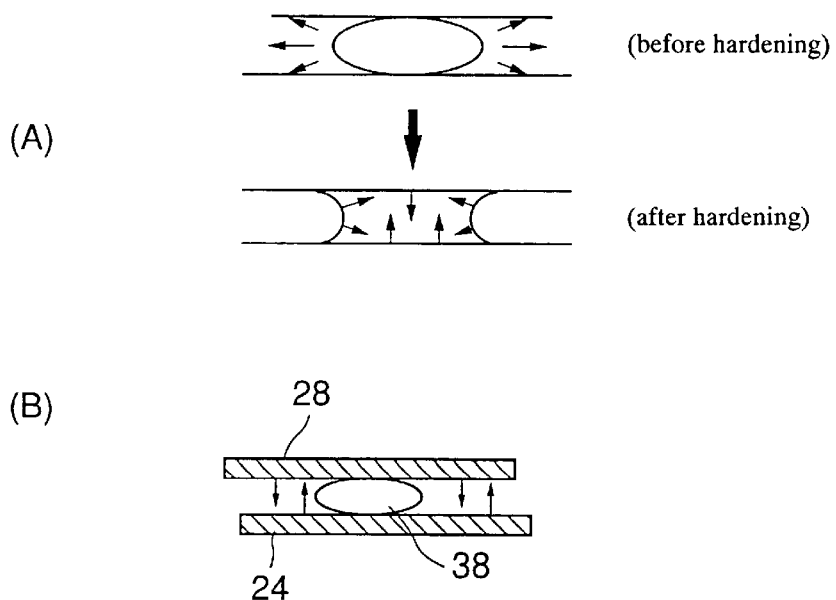
Figure 19:
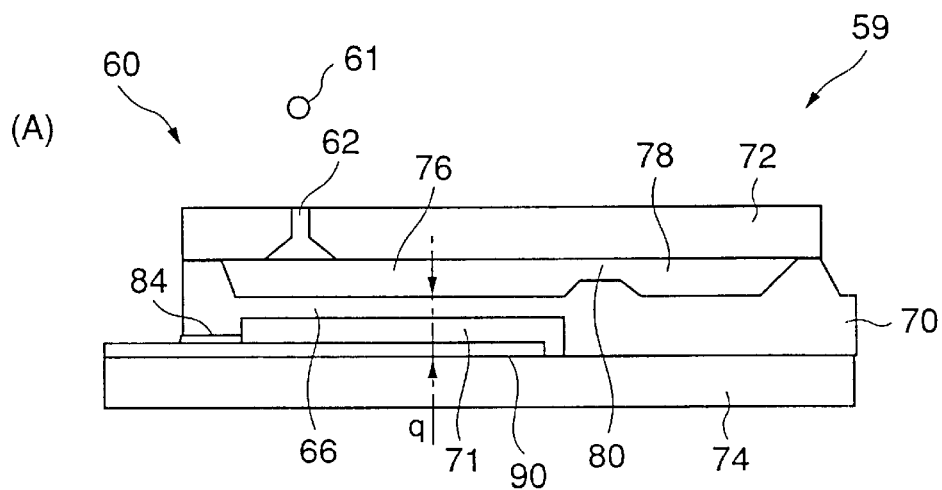
Figure 19:
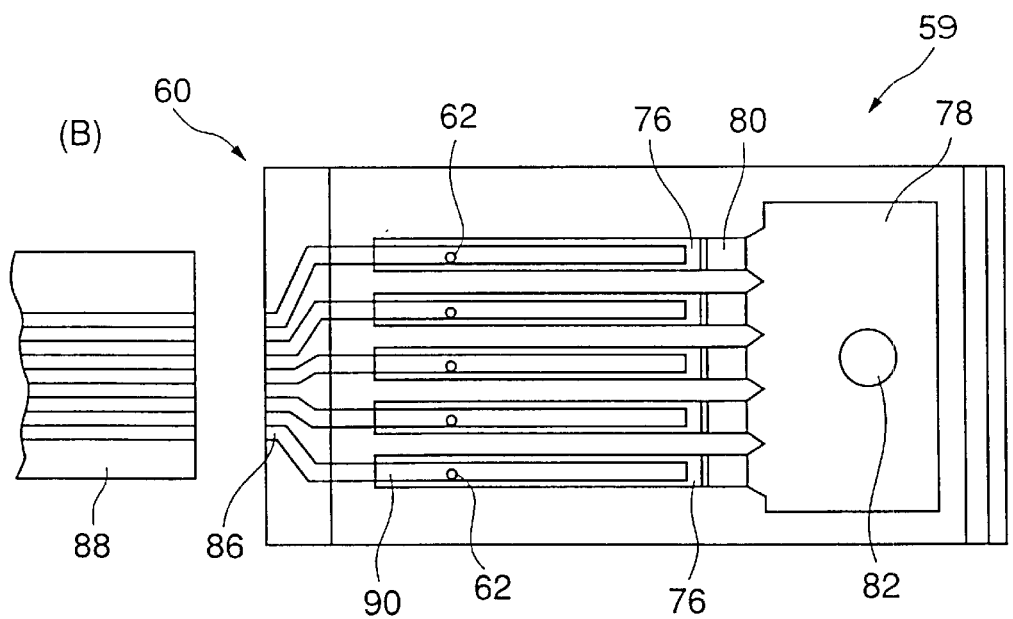
Figure 20:
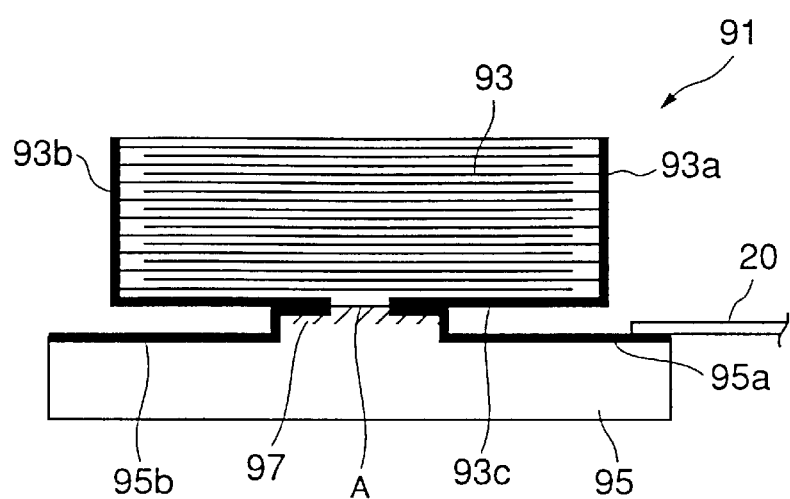
Figure 21:
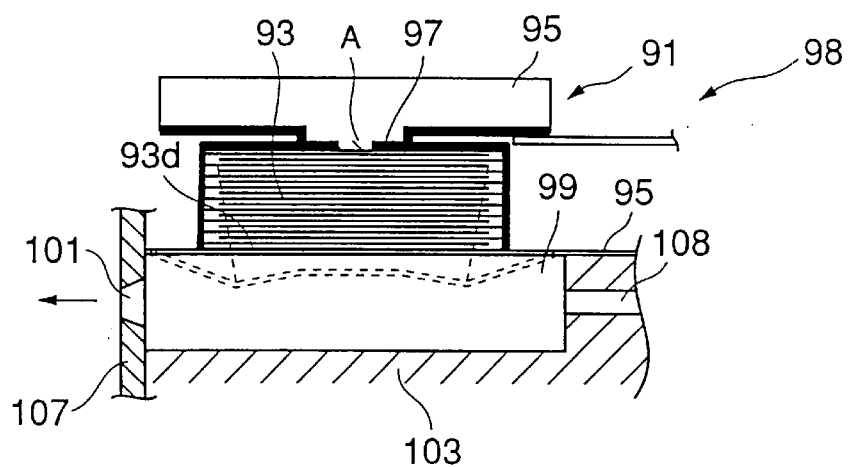
Figure 22:
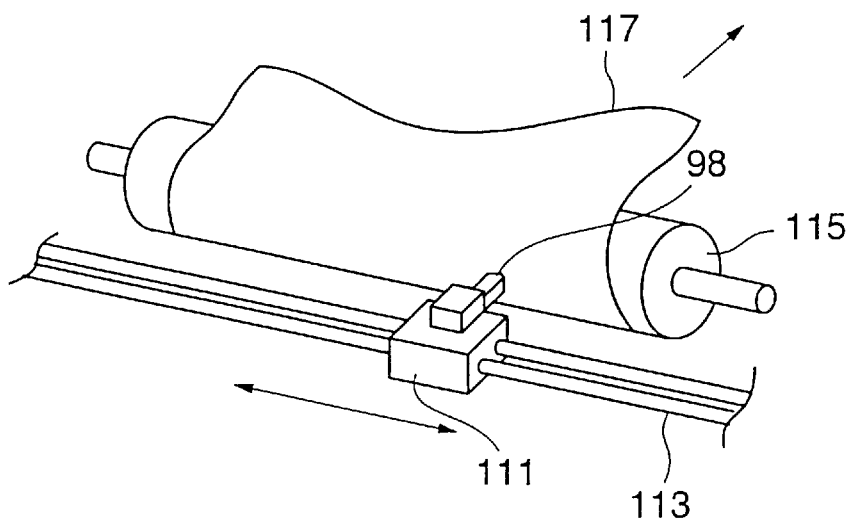
Figure 23:
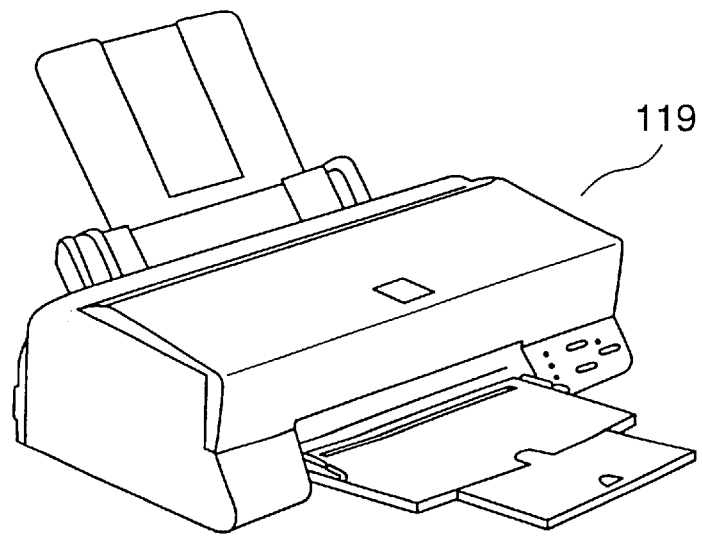
Figure 24:
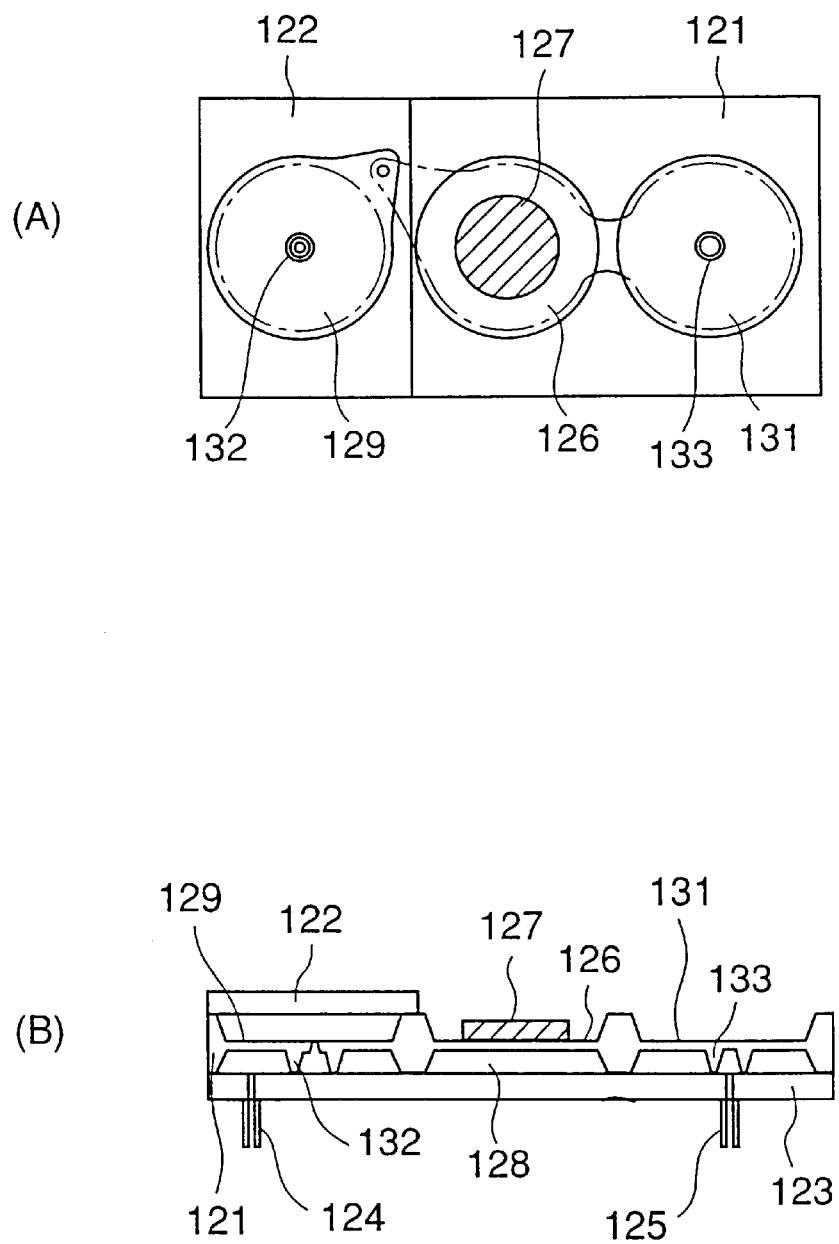
Figure 25:
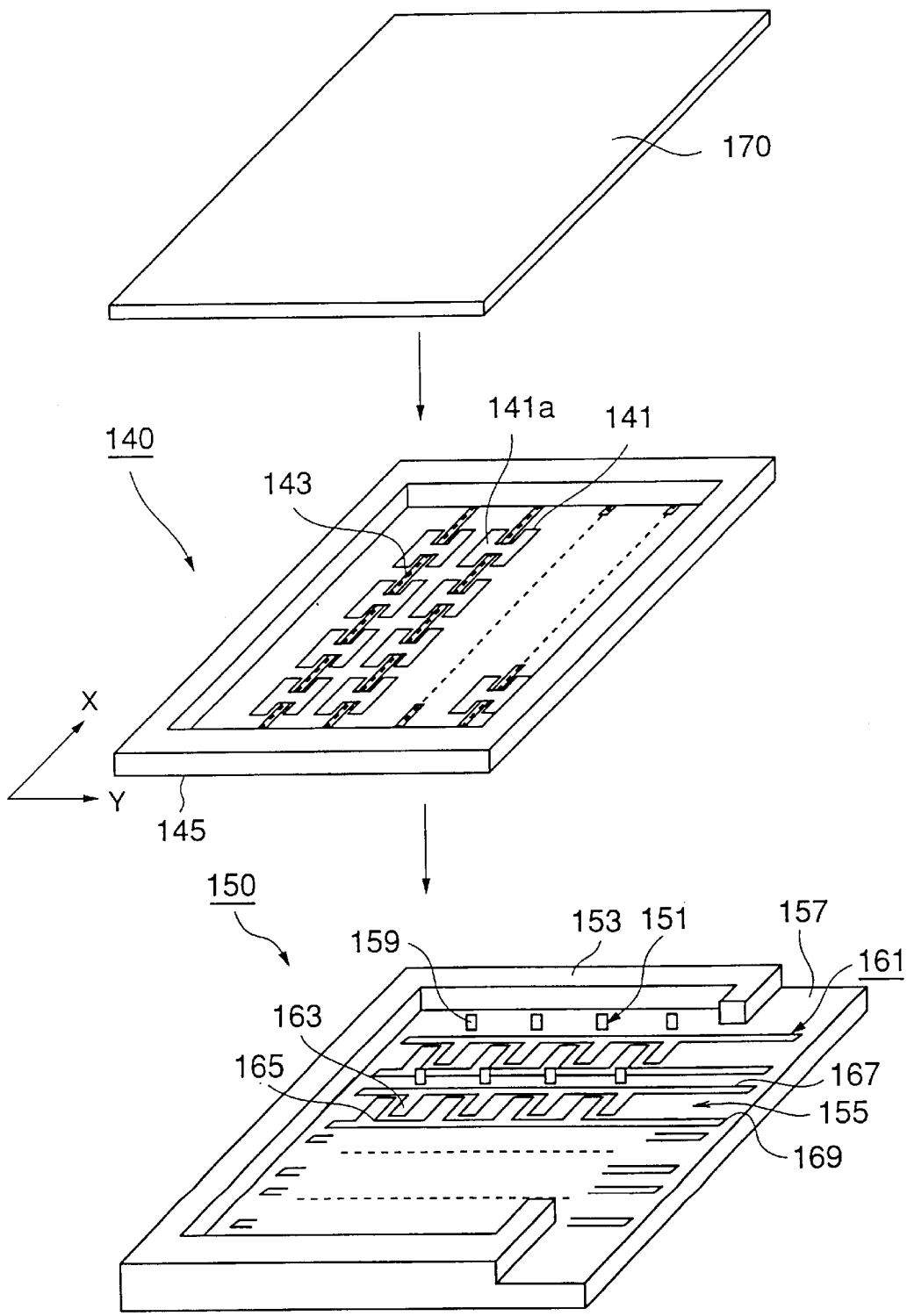
Figure 26:
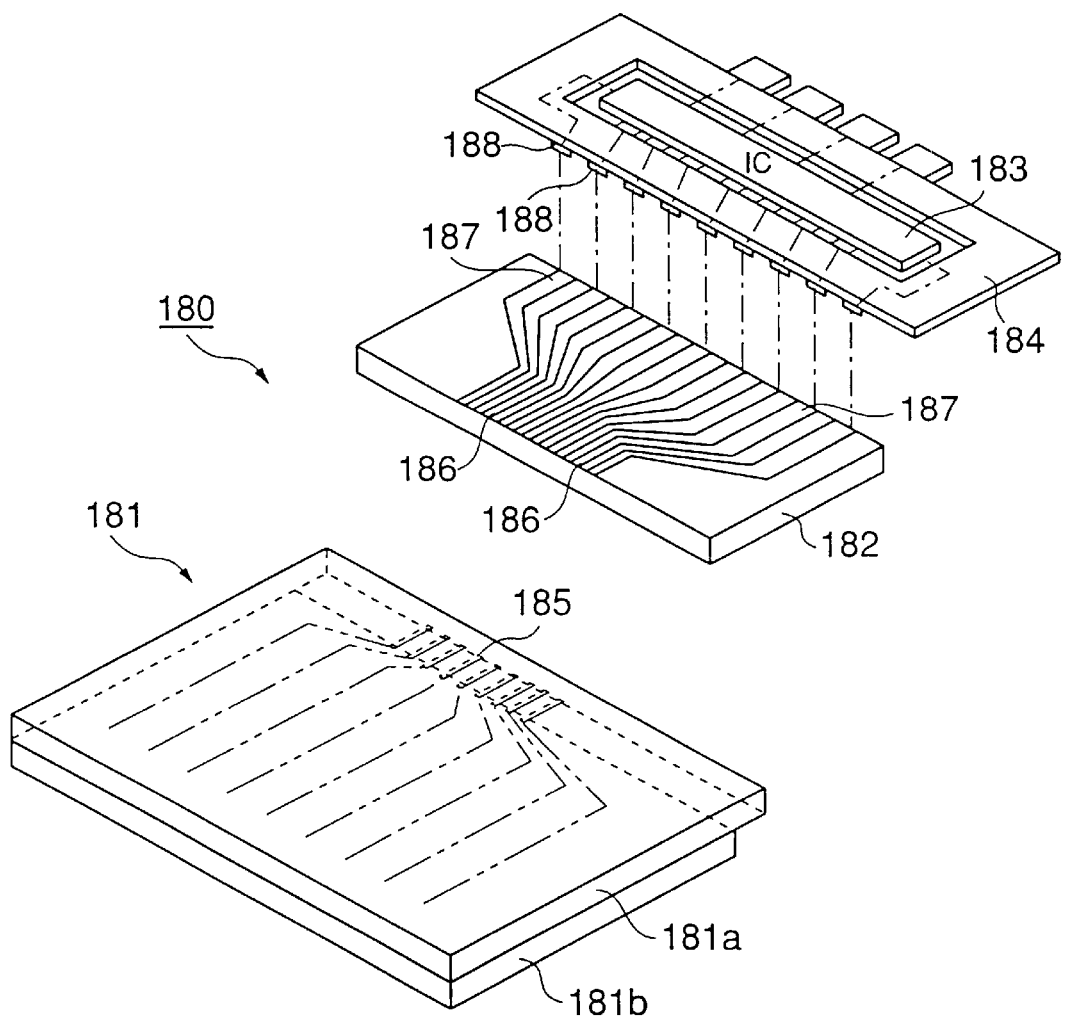
Figure 27:
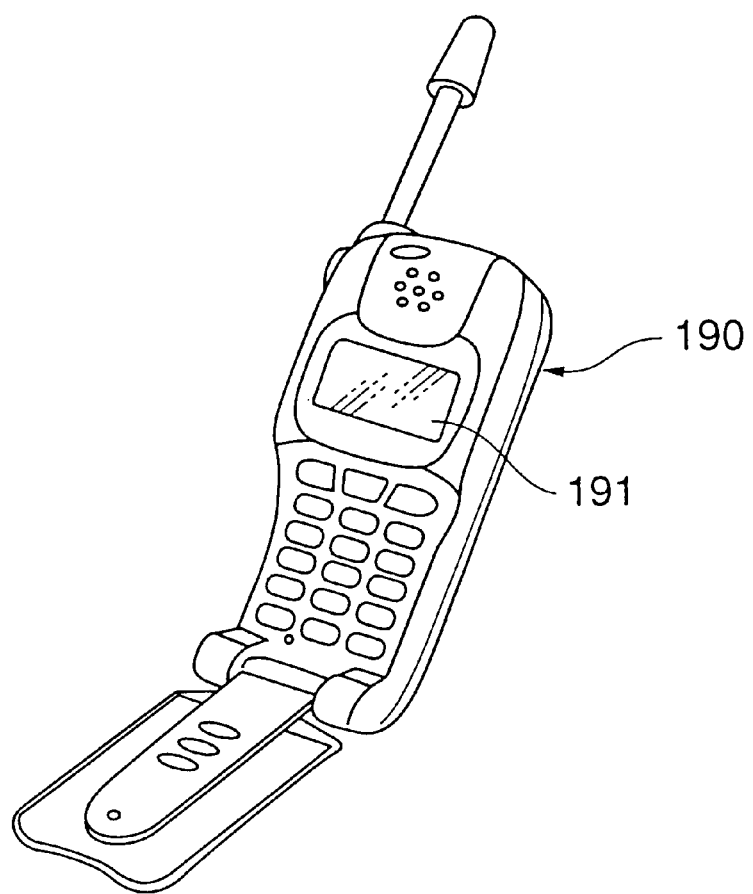
Figure 28:
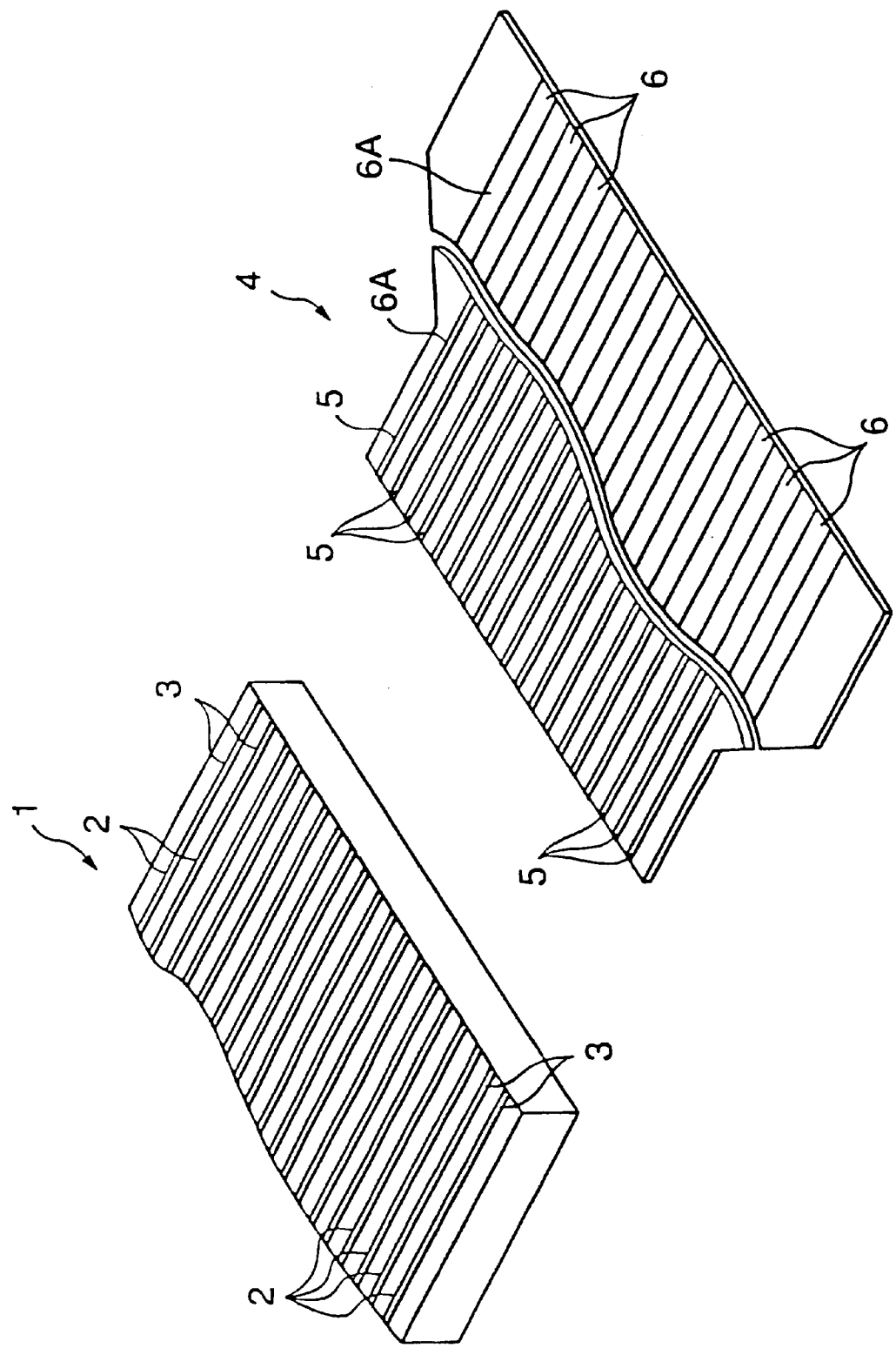
Figure 29:
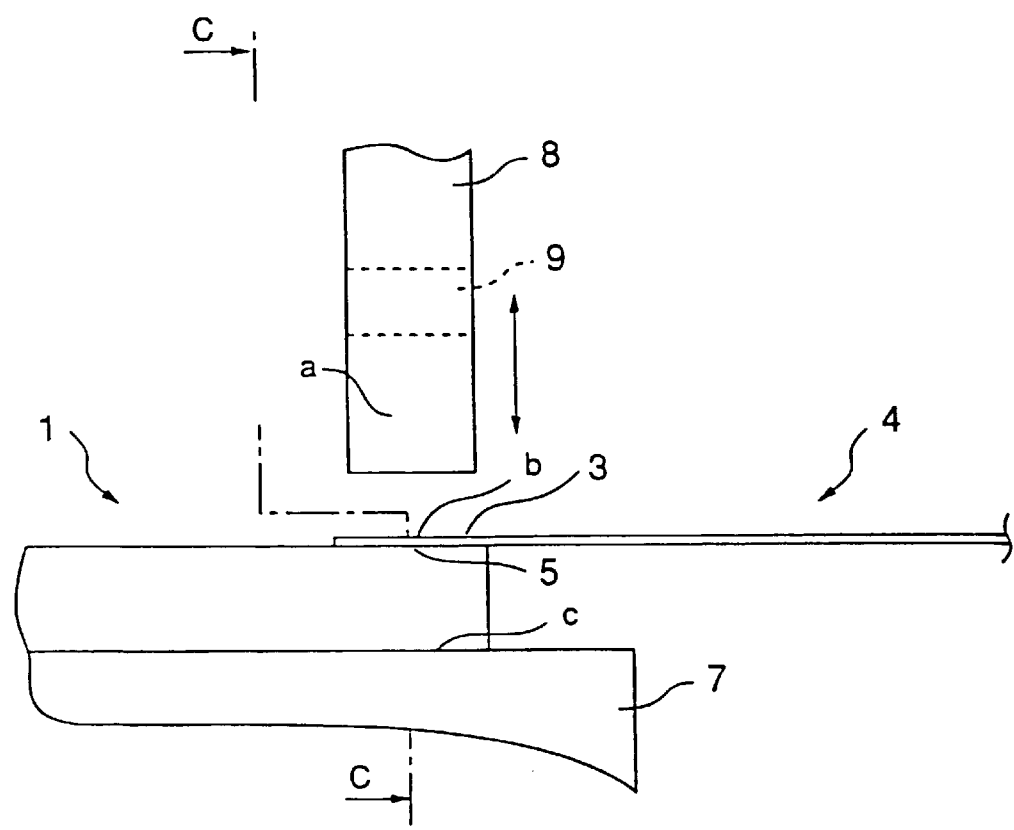
Figure 30:
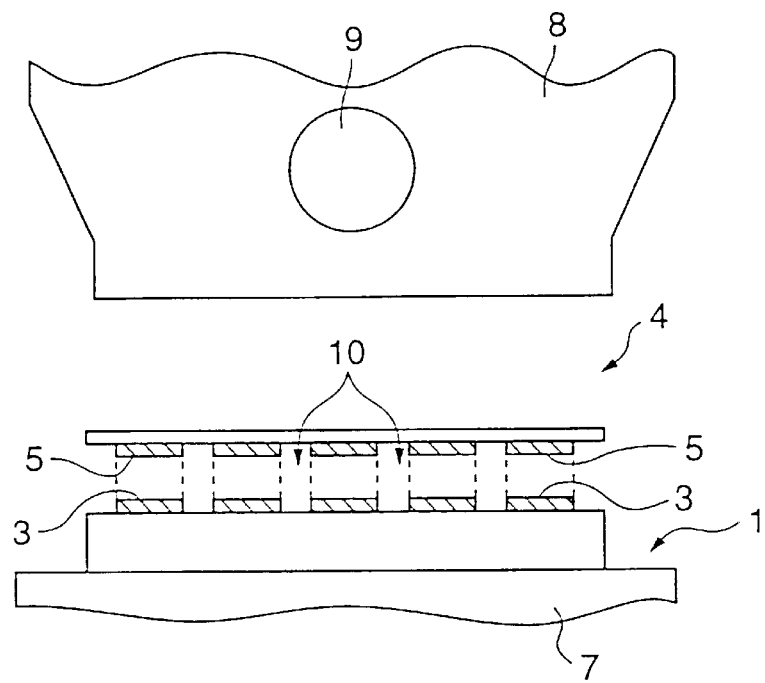

FIGS. 5(A) and 5(B) are diagrams descriptive of a connecting method using the connector for a narrow pitch preferred as the first embodiment of the present invention;

FIG. 6 is an enlarged view showing a condition of an adhesive accumulated in a groove of the connector for a narrow pitch preferred as the first embodiment of the present invention;

FIGS. 7(a) through 7(e) are diagrams descriptive of manufacturing steps (1) of the connector for a narrow pitch preferred as the first embodiment of the present invention;

FIGS. 8(f) through 8(i) are diagrams descriptive of manufacturing steps (2) of the connector for a narrow pitch preferred as the first embodiment of the present invention;

FIGS. 9(a) and 9(b) are diagrams descriptive of manufacturing steps of a connector for a narrow pitch preferred as a second embodiment of the present invention;

FIGS. 10(a) through 10(d) are diagrams descriptive of manufacturing steps of a connector for a narrow pitch preferred as a third embodiment of the present invention;

FIGS. 11(a) through 11(c) are diagrams descriptive of manufacturing steps (1) of a connector for a narrow pitch preferred as a fourth embodiment of the present invention;

FIGS. 12(d) through 12(f) are diagrams descriptive of manufacturing steps (2) of the connector for a narrow pitch preferred as the fourth embodiment of the present invention;

FIG. 13 is a perspective view showing as an object a portion of a connector for a narrow pitch preferred as a fifth embodiment of the present invention;

FIG. 14 is a diagram descriptive of a connection range of the connector for a narrow pitch preferred as the fifth embodiment;

FIG. 15 is a diagram descriptive of a problem to be solved by the connector for a narrow pitch preferred as the fifth embodiment;

FIGS. 16(A) and 16(B) are diagrams descriptive of a problem to be solved by the connector for a narrow pitch preferred as the fifth embodiment;

FIGS. 17(A) and 17(B) are diagrams descriptive of a function of the fifth embodiment;

FIGS. 18(A) and 18(B) are diagrams descriptive of the function of the fifth embodiment;

FIGS. 19(A) and 19(B) are diagrams descriptive of a configuration of an electrostatic actuator preferred as a sixth embodiment of the present invention;

FIG. 20 is a diagram descriptive of a piezoelectric actuator preferred as a seventh embodiment of the present invention;

FIG. 21 is a diagram descriptive of an ink jet head preferred as an eighth embodiment of the present invention;

FIG. 22 is a diagram descriptive of an interior of an ink jet printer preferred as a ninth embodiment of the present invention;

FIG. 23 is an external appearance view of the ink jet printer preferred as the ninth embodiment;

FIGS. 24(A) and 24(B) are diagrams descriptive of an example of micro machine preferred as a tenth embodiment of the present invention;

FIG. 25 is a diagram descriptive of a light modulator preferred as an example of an eleventh embodiment of the present invention;

FIG. 26 is a diagram descriptive of a liquid crystal panel preferred as a twelfth embodiment of the present invention;

FIG. 27 is a diagram descriptive of an electronic appliance preferred as a thirteenth embodiment of the present invention;

FIG. 28 is an enlarged view showing main parts of a connection object and a conventional connector composed of a flexible substrate;

FIG. 29 is a diagram descriptive of procedures for connecting the connection object to the conventional connector;

FIG. 30 is a sectional view taken along a C—C line in FIG. 29; and

Figure 31:
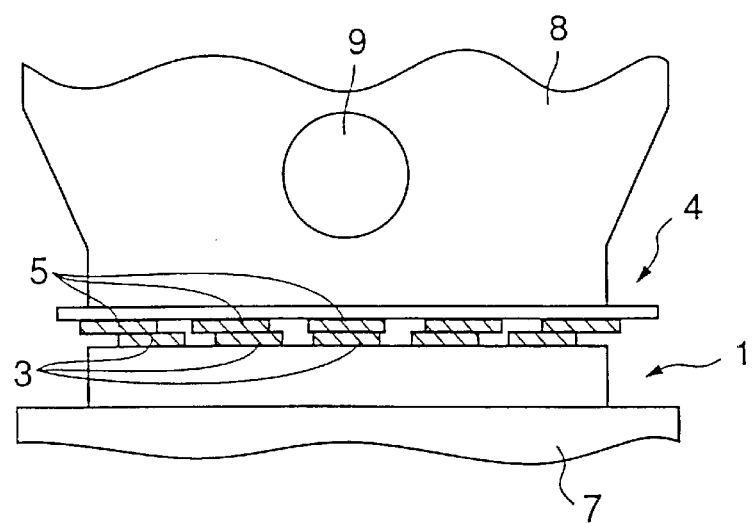

FIG. 31 is a diagram descriptive of a problem posed by a conventional art.

BEST MODE FOR CARRYING OUT THE INVENTION

Embodiment 1

Figure 1:
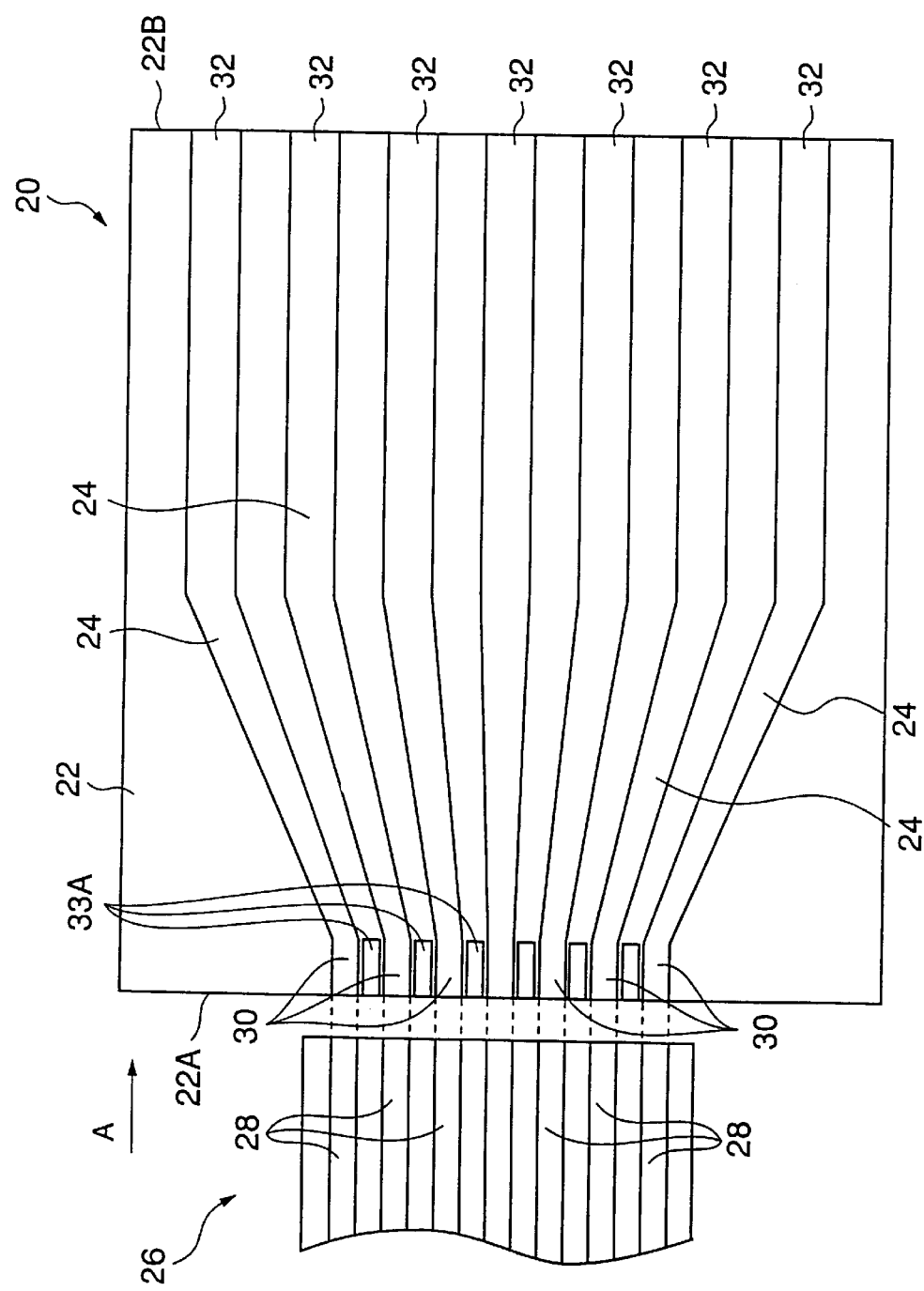
Figure 2:
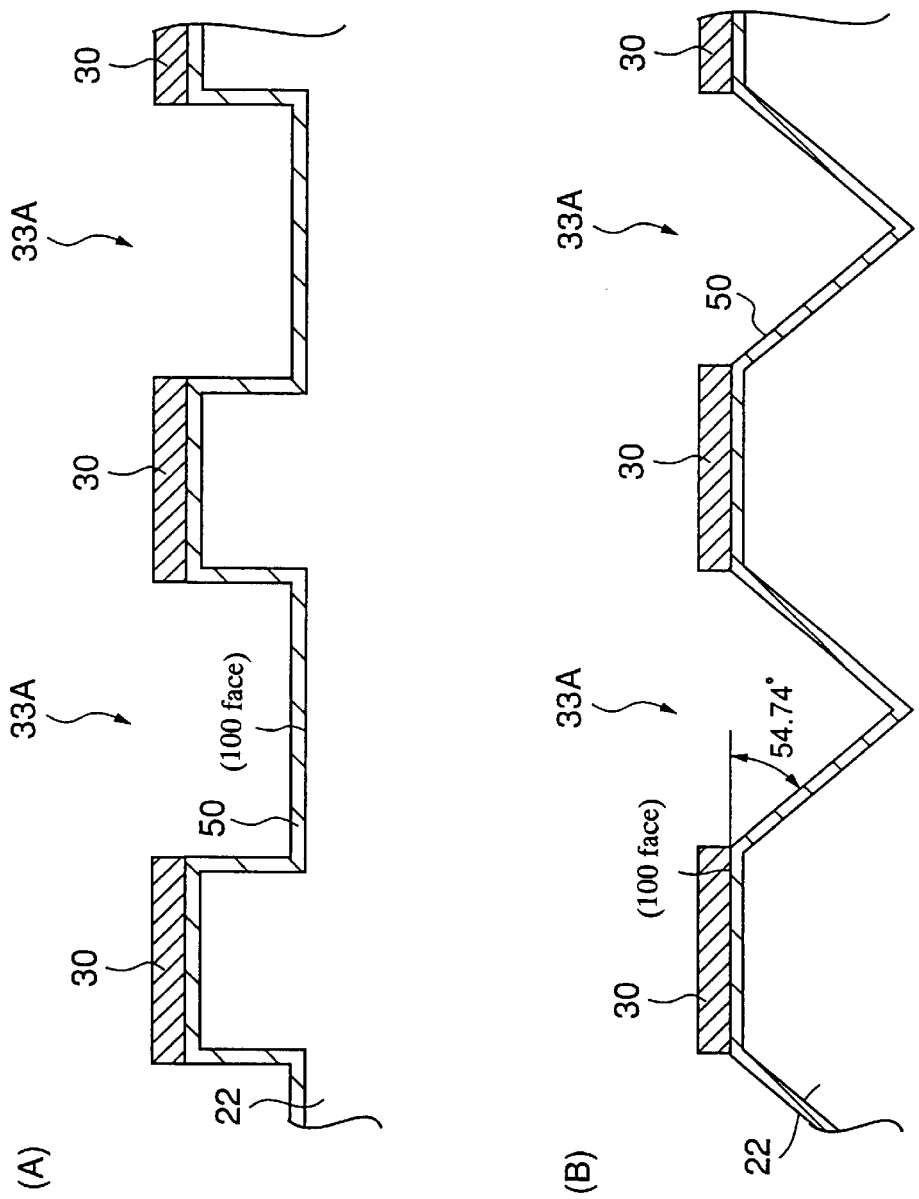

FIG. 1 is a front view showing a connector 20 for a narrow pitch preferred as a first embodiment and a terminal portion of a connection object 26 to which the connector is to be connected, and FIGS. 2(A) and 2(B) are side views as seen from a direction indicated by an arrow A in FIG. 1.

The connector 20 for a narrow pitch preferred as the first embodiment has a configuration wherein metal wires 24 are arranged on a substrate 22 as shown in FIG. 1.

The substrate 22 is composed of a rectangular single-crystal silicon and manufactured by cutting a semiconductor wafer into a lattice shape. Disposed on a surface of the substrate are a plurality of metal wires 24 so as to cross the substrate 22. Furthermore, terminal electrodes 30 which can be overlapped with terminal electrodes 28 formed on the connection object 26 are formed at ends of the metal wires 24 at a side, that is, an edge 22A of the substrate 22 (the terminal electrodes 30 and the terminal electrodes 28 are formed at an identical pitch).

At ends of the metal wires 24 on a side opposite to the end at which the terminal electrodes 30 are formed, that is, an edge 22B of the substrate 22, on the other hand, terminal electrodes 32 which have the same number of electrodes as that of electrodes on a side of the terminal electrodes 30 are formed at a magnified width and a magnified pitch (magnified twice in FIG. 1). Speaking concretely, the metal wires 24 disposed on the surface of the substrate 22 are configured to change a wiring width and a spacing between the wires in a section from the edge 22A to the edge 22B, and establish electrical conduction from the terminal electrodes 30 to the terminal electrodes 32.

Grooves 33A are formed among the plurality of terminal electrodes 30 which are disposed at the edge 22A of the substrate 22.

FIG. 2(A) is an enlarged side view of the edge 22A of the connector 20 for a narrow pitch. An insulating film 50 is formed on a surface including the groove 33A of a single-crystal silicon 46 as shown in FIG. 2(A). The metal wire 24 is disposed on the insulating film 50.

The terminal electrodes 30 of the connection object are to be bonded to the terminal electrodes 28 of the connector 20 for a narrow pitch with an anisotropic electrically conductive adhesive which contains electrically conductive particles. At a bonding step, the grooves 33A function as adhesive reservoirs which accommodate an excessive amount of the adhesive.

In order to form the grooves 33A which have a rectangular sectional shape as shown in FIG. 2(A), a single-crystal silicon which has a crystal face to be exposed as a (110) face on a surface is to be used for composing the substrate 22. Use of the single-crystal silicon which has the crystal face to be exposed as the (110) face makes it possible to form the groove with extremely little undercut independently of a spacing between the terminal electrodes 30 adjacent to each other since the single-crystal silicon has a high crystal orientation in a direction perpendicular to an etching solution such as an aqueous solution of KOH or ethylenediamine (direction of depth of the terminal electrodes).

In the first embodiment, a depth of the grooves 33A is set on the order of 100000 angstroms which is approximately three times of a particle diameter of the electrically conductive particles (approximately 30000 angstroms) to securely prevent the electrically conductive particles from being sandwiched between the terminal electrodes 30 adjacent to each other.

Though the grooves 33A have the rectangular sectional shape in the first embodiment described above, the grooves 33A may have a V sectional shape as shown in FIG. 2(B). In this case, a single-crystal silicon having a crystal face which is to be exposed on a surface as a (100) face is to be used for composing the substrate 22. Use of the single-crystal silicon having the crystal face which is to be exposed on the surface as the (100) face makes it possible to form the grooves 33A in the V shape at an angle of 54.74 degrees relative to the (100) face by anisotropically etching a surface of the single-crystal silicon using an etching solution such as an aqueous solution of KOH or ethylenediamine. In addition, a depth of the V-shaped grooves 33A can be accurately controlled dependently on a width of a window (made, for example, of an $SiO_2$ film) set on the (100) face.

The connection object 26 on which the terminal electrodes 28 are to be formed is, for example, a micro machine which uses a fine moving mechanism formed on a substrate and fine wires pulled out to apply a voltage to the moving mechanism. A piezoelectric actuator using a piezoelectric element, an electrostatic actuator using an electrostatic oscillator or the like is an example of the micro machine.

Concrete examples of the connection object 26 will be described in detailed embodiments explained later.

Now, description will be made of procedures for connecting the connector 20 for a narrow pitch having the above described configuration to the connection object 26.

Figure 3:
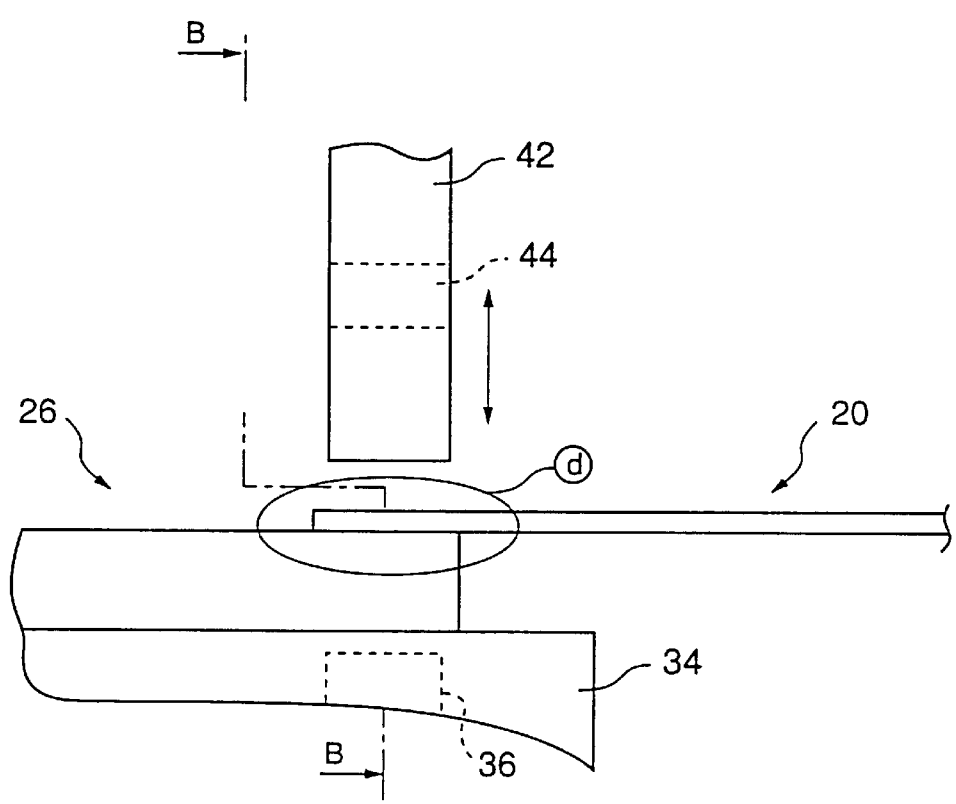
FIG. 3 is a diagram descriptive of a connecting method using the connector for a narrow pitch preferred as the first embodiment of the present invention.
Figure 4:
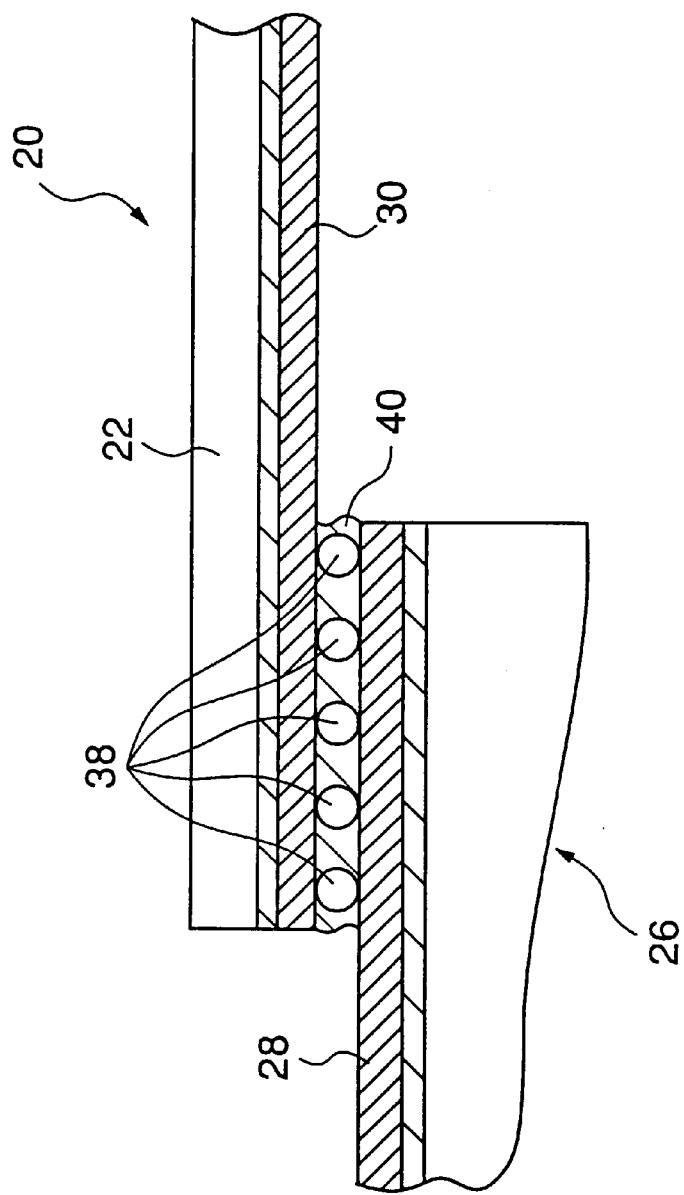
FIG. 4 is an enlarged view of a portion d of FIG. 3.

FIG. 3 is a diagram descriptive of the procedures for connecting the connection object 26 to the connector 20 for a narrow pitch, FIG. 4 is an enlarged view of a portion d in FIG. 3, and FIGS. 5(A) and 5(B) are sectional views taken along a B—B line in FIG. 3.

When the connector 20 for a narrow pitch is to be connected to the connection object 26, the connection object 26 is placed on a top surface of a bonding stage 34 as shown in FIGS. 3, 4, 5(A) and 5(B). Disposed in the bonding stage 34 is a lower heater 36 so that the connection object 26 can be heated by operating the lower heater 36.

Over the connection object 26 which is placed on the top surface of the bonding stage 34, the connector 20 is disposed so as to overlap the terminal electrodes 30 with the terminal electrodes 28. An anisotropic electrically conductive adhesive 40 which contains electrically conductive particles 38 is applied between the terminal electrodes 28 and the terminal electrodes 30 as shown in FIG. 4 and the connector 20 is pressed from a side of a rear side surface to bring the electrically conductive particles 38 into contact with the terminal electrodes 28 and the terminal electrodes 30, thereby the terminal electrodes are conductive to each other by way of the electrically conductive particles 38. Hardening of the anisotropic electrically conductive adhesive 40 containing the electrically conductive particles 38 is accelerated by operating the lower heater 36 and a heater built in a bonding tool described later.

A bonding tool 42 is disposed over the terminal electrodes 30, that is, over the connector 20 for a narrow pitch. The bonding tool 42 is attached to a linear guide (not shown) so that the bonding tool 42 itself can be raised and lowered along the linear guide. By lowering the bonding tool 42, the connector 20 for a narrow pitch can be pressed from the side of the rear surface and the overlapped terminal electrodes 28 and terminal electrodes 30 can be brought into close contact with each other. An upper heater 44 is built in the bonding tool 42 so that a tip of the bonding tool 42 and the connector 20 for a narrow pitch can be heated by operating the upper heater 44.

The upper heater 44 and the lower heater 36 are set so that a temperature will be uniform around a border line between the terminal electrodes 28 and the terminal electrodes 30, that is, so that no temperature difference is produced between the substrate 22 and the connection object 26 when the bonding tool 42 is lowered and a rear surface of the substrate 22 is pressed by the tip of the bonding tool 42. It is needless to say that the upper heater 44 and the lower heater 36 are set at a temperature which is sufficient at least for accelerating the hardening of the anisotropic electrically conductive adhesive 40.

After the upper heater 44 and the lower heater 36 are set at the temperature as described above, the terminal electrodes 28 are connected to the terminal electrodes 30 by lowering the bonding tool 42 so that the bonding tool 42 is set in the condition shown in FIG. 5(B) from a condition shown in FIG. 5(A). Since the substrate 22 and the connection object 26 are heated to an identical temperature with no temperature difference at this connecting stage, the substrate 22 and the connection object 26 which are made of an identical material are elongated at an identical ratio by heating and relative locations of the terminal electrodes 28 and the terminal electrodes 30 are not changed. Accordingly, the connector for a narrow pitch is capable of joining the terminal electrodes securely, or preventing a defect such as enhancement of a resistance value, improper joining or short circuit between the adjacent terminals from being caused at a time to connect the electrodes.

Silicon is used as a material of the substrate 22 and the connection object 26 in the first embodiment described above and the inventor has confirmed by various examinations that the terminal electrodes can be connected securely even at a wiring pitch of 25 $\mu$m or narrower when silicon is used as the material (the terminal electrodes can be connected securely even at a wiring pitch on the order of 15 $\mu$m and the terminal electrodes are connectable even at a wiring pitch of 15 $\mu$m or narrower dependently on connecting resolution).

Since the grooves 33A are formed among the plurality of terminal electrodes 30 in the first embodiment, an excessive amount of the anisotropic electrically conductive adhesive 40 applied to surfaces of the terminal electrodes 30 is moved toward the grooves 33A and the adhesive 40 containing the electrically conductive particles 38 is reserved in the grooves 33A as shown in FIG. 6 when the terminal electrodes 28 are overlapped with the terminal electrodes 30. Since the grooves 33A which function as reservoirs for the anisotropic electrically conductive adhesive 40 is formed as described above, the electrically conductive particles 38 are not sandwiched between members other than the terminal electrodes 28 and the terminal electrodes 30. Accordingly, the connector 20 for a narrow pitch is capable of preventing adjacent terminal electrodes from being shorted by sandwiching the electrically conductive particles 38 between the adjacent terminal electrodes.

Though the substrate 22 and the connection object 26 are made of an identical material in the first embodiment described above, the present invention is not limited by the embodiment. Even when these members are made of different materials and have different coefficients of thermal expansion, it is possible to securely join the substrate 22 with the connection object 26. In this case, a temperature difference is positively produced between the substrate 22 and the connection object 26 by changing output values from the upper heater 44 and the lower heater 36. Speaking concretely, a heater which is disposed on a side of a small coefficient of thermal expansion is set at a high temperature, whereas a heater which is set on a side of a large coefficient of thermal expansion is set at a low temperature. By positively producing a temperature difference as described above, it is possible to absorb an elongation caused due to a difference between coefficients of thermal expansion and prevent relative positions from being deviated between the terminal electrodes, thereby securely joining and connecting the terminal electrodes while preventing troubles such as enhancement of a resistance value, improper joining and short circuit between adjacent terminals.

Though the first embodiment has been described above as an example where the terminal electrodes 30 of the substrate 22 are joined to the terminal electrodes 28 of the connection object 26 using the anisotropic electrically conductive adhesive, the present invention is not limited by the embodiment. In another mode, the terminal electrodes can be joined using an anisotropic electrically conductive film which is made of an anisotropic electrically conductive adhesive.

Furthermore, the terminal electrodes can be joined by alloy connection which uses an alloy such as a solder or metal connection which presses metals of the terminal electrodes 22 and 30 to each other under pressure. Also in case of the alloy connection or the metal connection, formation of the grooves 33A makes it possible to prevent the terminal electrodes from being deformed by heat or a pressure at a joining time or shorted by outflow of an alloy metal. Furthermore, the formation of the grooves 33A provides an effect to prolong a creeping distance of a space between adjacent terminal electrodes, thereby suppressing an influence due to noise.

Furthermore, the first embodiment is an example where the depth of the grooves 33A is specified in relation to the diameter of the electrically conductive particles on a premise that the terminal electrodes 22 and 30 are bonded with the anisotropic electrically conductive adhesive or the anisotropic electrically conductive film. However, this specific method is insignificant when the terminal electrodes 22 and 30 are to be connected without using the anisotropic electrically conductive adhesive or the anisotropic electrically conductive film. The depth of the grooves 33A may therefore be determined in relation to a width of the groove. When the groove has a great width, for example, the grooves may have a shallow depth since the groove has a large spatial volume even when it has the shallow depth. When the grooves have a narrow width in contrast, the grooves must have an extensive depth so that it has a large spatial volume. A depth on the order of 5% to 150% of a groove width may be considered as a reference guide for the depth of the grooves 33A. Too great a depth of the grooves makes the terminal portion liable to fall down, thereby posing a problem in strength. From view points of strength and manufacturing facility, a depth on the order of 25% of a groove width is most preferable.

Now, description will be made of a manufacturing method of the connector 20 for a narrow pitch preferred as the first embodiment.

Figure 7:
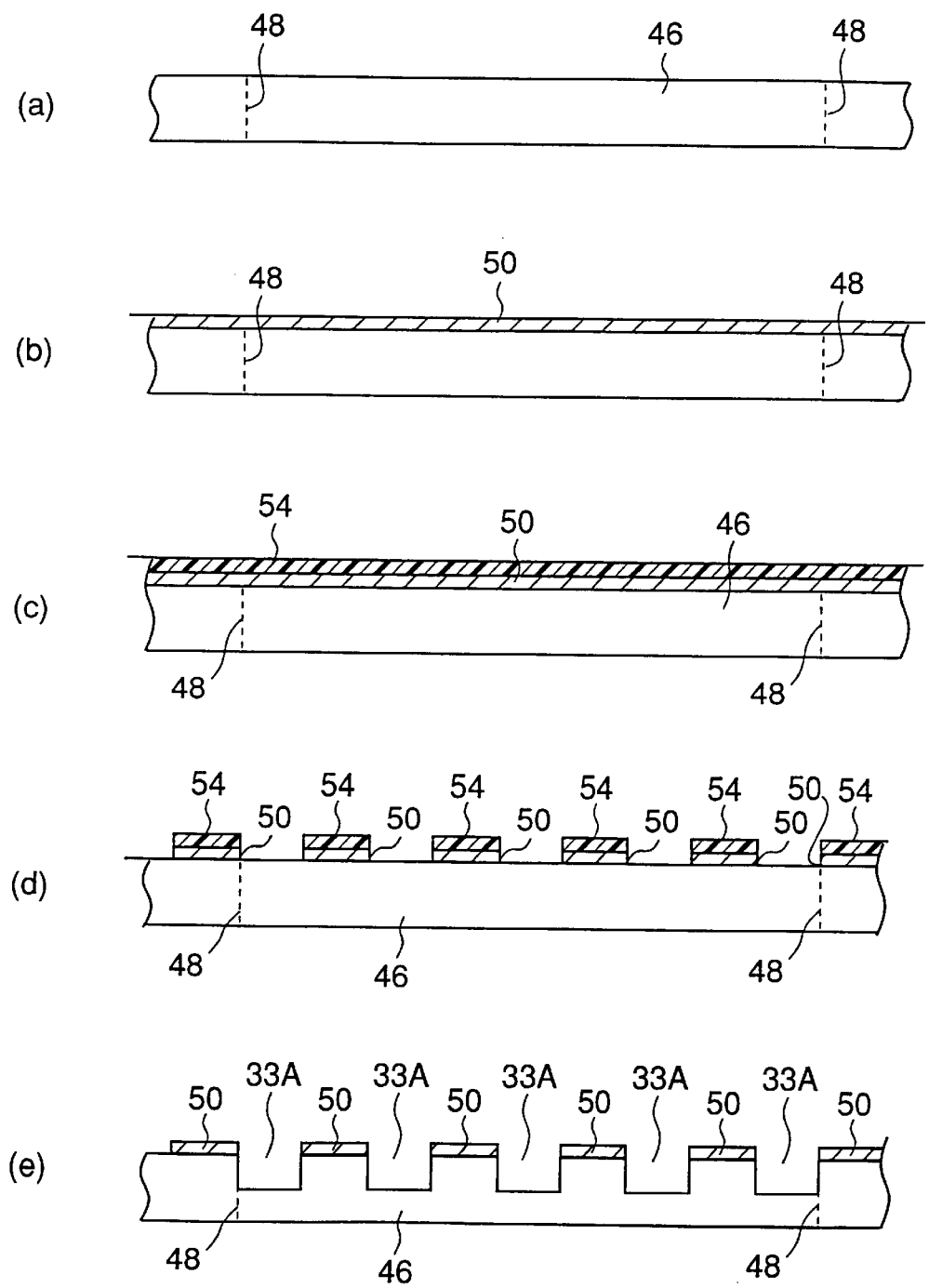

FIGS. 7(*a*), 7(*b*), 7(*c*), 7(*d*), 7(*e*), 8(*f*), 8(*g*), 8(*h*) and 8(*i*) are diagrams descriptive of manufacturing procedures for the connector 20 for a narrow pitch preferred as the first embodiment. These drawings show conditions of the metal wires 24 formed on the substrate 22 as seen from a direction indicated by an arrow A in FIG. 1.

FIG. 7(a) shows a semiconductor wafer 46 made of single-crystal silicon on which the metal wires 24 are to be formed. Broken lines in FIG. 7(a) indicate dicing lines 48 for separation from connectors 20 for a narrow pitch which are to be formed at adjacent locations.

An insulating film 50 having thickness of 5000 to 20000 angstroms is formed on a surface of the semiconductor wafer 46 as shown in FIG. 7(b). This insulating film 50 may be made, for example, of BPSG (boron-phospho-silicate glass) deposited by a CVD method or an oxide produced by dry thermal oxidation or wet thermal oxidation.

After the insulating film 50 has been formed on the semiconductor wafer 46 as described above, a photoresist film 54 is coated over this oxide film as shown in FIG. 7(c). Then, the insulating film 50 and the photoresist film 54 are patterned by carrying out exposure and development. Then, the oxide film is removed to expose a surface of the silicon as shown in FIG. 7(d) for forming grooves. Furthermore, the resist is released by washing and grooves are formed as shown in FIG. 7(e) by anisotropically etching the surface of the semiconductor wafer using an etching solution such as an aqueous solution of KOH, an aqueous solution of ethyl-enediamine or the like. Thereafter, an insulating film is formed on the surface of the semiconductor wafer as shown in FIG. 8(f) by depositing the BPSG by the CVD method or producing the thermal oxide film by the dry thermal oxidation or the wet thermal oxidation.

The semiconductor wafer on which the insulating film has been formed is placed in an argon atmosphere at a pressure of 2 to 5 mTorr and a temperature of 150 to 300° C. Using Al—Cu, Al—Si—Cu, Al—Si, Ni, Cr, Au or the like as a target, a metal film 52 is deposited to thickness of 200 to 20000 angstroms by sputtering with an input power of DC 9 to 12 kW for forming metal wires which have the same composition as that of the target (FIG. 8(g)). Otherwise, The metal film 52 may be formed by depositing Au to thickness on the order of 1000 angstroms on a base of Cr.

Figure 8:
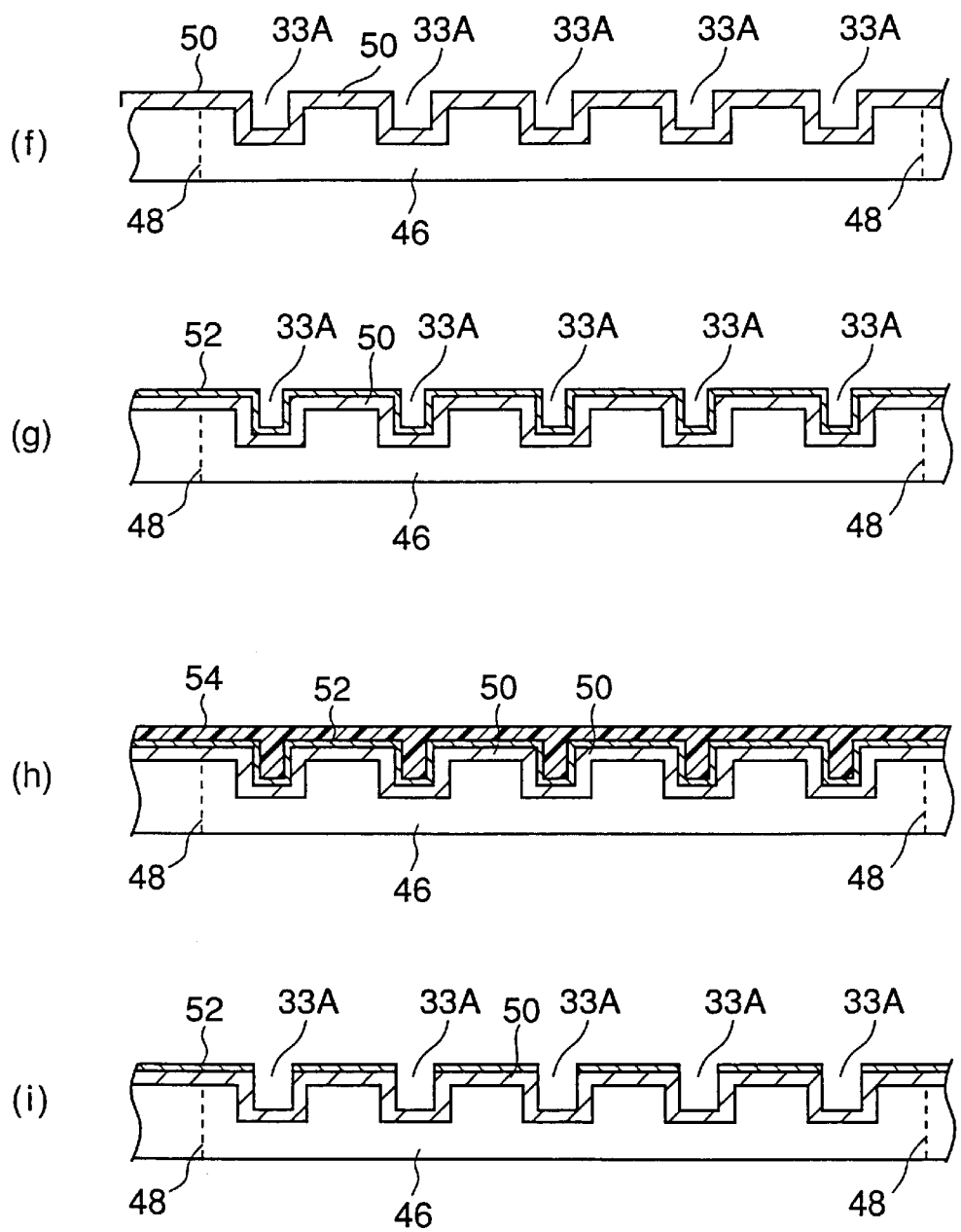

After forming the metal film 52, a photoresist film 54 is coated as shown in FIG. 8(h). Furthermore, metal wires are formed as shown in FIG. 8(i) by etching the metal film 52 using as a mask the photoresist film which has been exposed and developed.

After the metal wires have been formed on the semiconductor wafer, the connector for a narrow pitch is cut out from the semiconductor wafer by carrying out a cutting work along the dicing lines.

Embodiment 2

Though the metal wires are not left at all in the grooves in the first embodiment described above, the metal wires may be left in the grooves.

In order to leave the metal wires in the grooves, the insulating film 50 is patterned while adjusting exposure so as to leave the resist film 54 on bottoms of the grooves as shown in FIG. 9(a) after coating the resist film 54 as shown in FIG. 8(h). The metal wires can be left on the bottoms of the grooves as shown in FIG. 9(b) by carrying out etching in a condition where the resist film 54 is left on the bottoms of the grooves.

When the grooves are deep, the resist is to be coated by spraying a resist, or an electrodeposition resist to form the resist film 54 before coating the resist film 54 shown in FIG. 8(h) and patterned by exposing the resist to projected rays. By patterning the resist as described above, it is possible to obtain a substrate of a good quality which is scarcely troubled or defective by short circuit or wire breakage.

The metal wires left on the bottoms of the grooves enhance bonding strength at a step of bonding the connection object to the connector for a narrow pitch. Enhanced bonding strength provides connection having high resistance to humidity.

Embodiment 3

Though each of the first embodiment and the second embodiment is configured to completely insulate the groove from the single-crystal silicon with the insulating film, the third embodiment is configured not only to leave a metal wire on the bottom of the grooves but also to make the metal wire conductive to a single-crystal silicon plate and connect the metal wire in the groove to a ground wiring portion (negative electrode) or a power source wiring portion (positive electrode).

By disposing the metal wire as described above, it is possible to set the single-crystal silicon plate at a potential identical to that of the ground wiring portion (negative electrode) or the power source wiring portion (positive electrode), thereby stabilizing the potential of the single-crystal silicon plate.

Furthermore, it is possible to adequately heat the metal wire after it is formed or control a resistivity of a single-crystal silicon plate to be used to 0.3 Ωcm or lower in order to improve adhesion of the metal wire formed in the groove to the single-crystal silicon: plate and an ohmic contact. Such heating or control makes it possible to prevent an element from operating erroneously due to line noise in a fine wiring portion. Furthermore, the heating or control makes it possible to reduce radiation noise by a function of electrostatic shielding.

Now, description will be made of a manufacturing method of a connector for a narrow pitch which allows the metal wire to be left on the bottom of the groove and makes the metal wire conductive to the single-crystal silicon plate.

Figure 10:
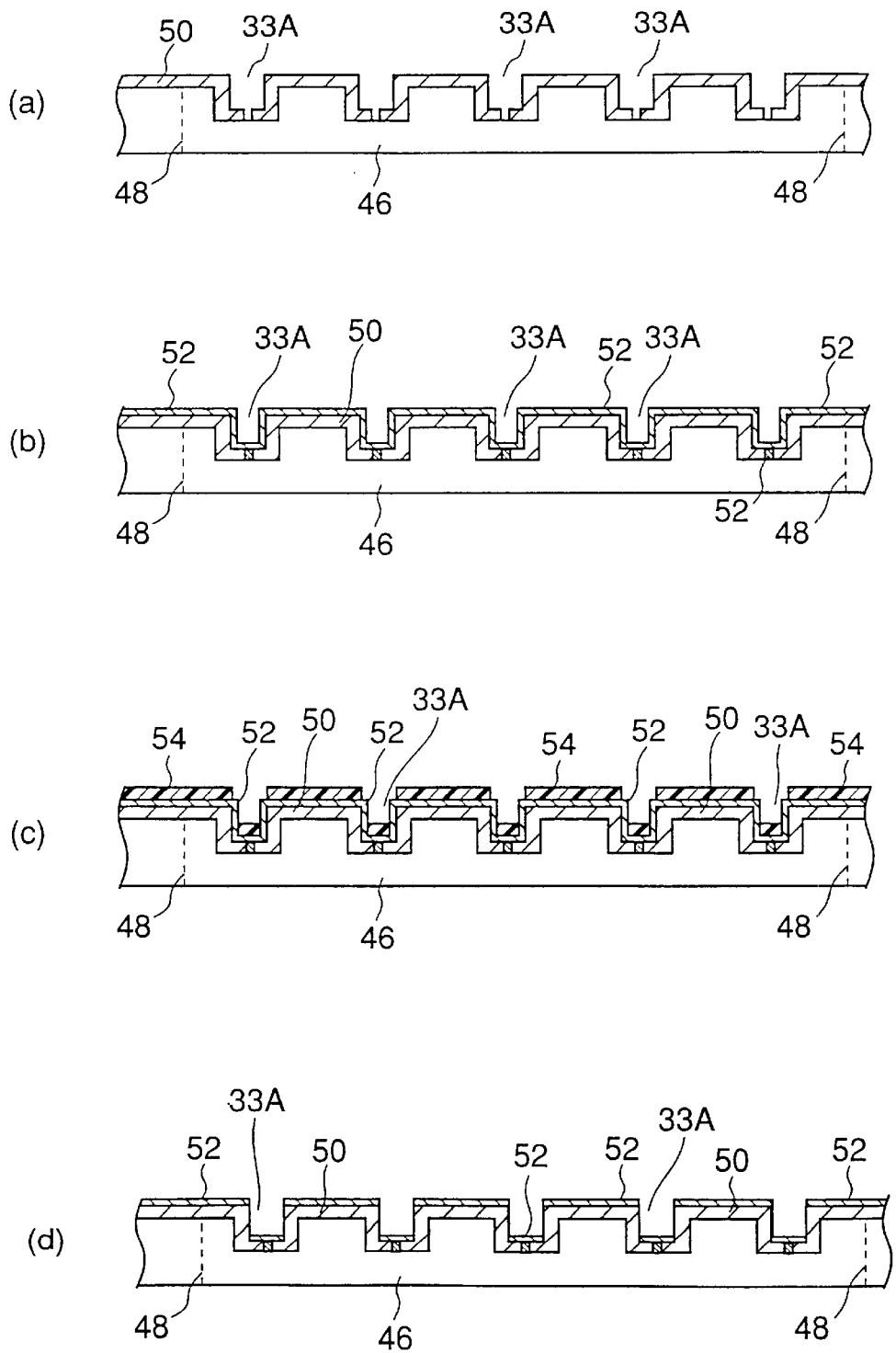

A groove is formed in the single-crystal silicon plate as shown in FIG. 8(f) descriptive of the first embodiment and after forming an insulating film, the insulating film is partially removed from the bottom of the groove as shown in FIG. 10(a) by etching with fluorine. In this condition, a metal film is deposited as shown in FIG. 10(b) for forming a metal wire. Then, a resist film is coated and patterned as shown in FIG. 10(c). By etching the resist film in this condition, the metal wire can be left on the bottom of the groove and made conductive to the single-crystal silicon plate as shown in FIG. 10(d).

Embodiment 4

Though all the manufacturing methods which have been described above are of a type which forms the insulating film 50 in the groove 33A, the insulating film 50 may not be formed in the groove 33A.

Description will therefore be made of a manufacturing method which does not form the insulating film 50 in the groove 33A.

FIGS. 11(a), 11(b), 11(c), 12(d), 12(e) and 12(f) are diagrams descriptive of procedures for manufacturing a connector 20 for a narrow pitch wherein the insulating film 50 is not formed in grooves 33A.

FIG. 11(a) shows a semiconductor wafer 46 made of single-crystal silicon on which the metal wires 24 are to be formed. Broken lines in FIG. 11(a) indicate dicing lines 48 for separating the connector 20 for a narrow pitch from those formed at adjacent locations.

An insulating film 50 which has thickness of 5000 to 20000 angstroms is formed on a surface of the semiconductor wafer 46 as shown in FIG. 11(b). This insulating film 50 is formed by a method similar to that described with reference to FIG. 7(b).

After forming the insulating film 50 on the surface of the semiconductor wafer 46, the semiconductor wafer 46 on which the insulating film 50 is disposed is placed in an argon atmosphere at a pressure of 2 to 5 mTorr and a temperature of 150 to 300° C., and a metal film 52 is deposited to thickness of 200 to 20000 angstroms by sputtering with an input power of DC 9 to 12 kW using Al—Cu, Al—Si—Cu, Al—Si, Ni, Cr, Au or the like as a target, thereby forming metal wires 24 which have a composition identical to that of the target. Alternatively, the metal film 52 may be formed by depositing Au to thickness on the order of 1000 angstroms on a base of Cr. This condition is shown in FIG. 11(c).

After the metal film 52 is formed on a top surface of the insulating film 50, a photoresist film 54 is coated over the metal film 52 as shown in FIG. 12(d). Then, the photoresist film 54 is removed by photolithographic patterning from locations other than those at which the metal wires 24 are to be formed, and the metal film 52 and the insulating film 50 are etched as shown in FIG. 12(e) using the photoresist film 54 as a mask.

After metal wires 24 are formed by etching the metal film 52 and the insulating film 50 and the surface of the semiconductor wafer 46 is exposed, grooves 33A are formed on both sides of the metal wires 24 (terminal electrodes 30) by anisotropically etching the surface of the semiconductor wafer 46 as shown in FIG. 12(f) using an etching solution such as an aqueous solution of KOH or an aqueous solution of ethylenediamine. After the grooves 33A are formed, the photoresist film 54 is removed from tops of the metal wires 24 and then: the connector 20 for a narrow pitch is cut out from the semiconductor wafer 46 by carrying out a cutting work along the dicing lines 48.

Embodiment 5

FIG. 13 is a diagram descriptive of a connector for a narrow pitch preferred as a fifth embodiment. In FIG. 13, members which are the same as or correspond to those in the first embodiment are represented by the same reference numerals.

A connector 55 for a narrow pitch preferred as the fifth embodiment is configured so that grooves 56 formed at an end is not extended to an end of the connector as shown in FIG. 13. The grooves 56 are set at a length which is longer than a connection range L as shown in FIG. 14.

Description will be made below of an effect which is obtained by setting the length of the grooves 56 longer than the connection range L.

When the length of the grooves 56 is set shorter than the connection range L, a space enclosed by a connection object and the connector for a narrow pitch constitutes an enclosed space. Accordingly, air may be involved and air bubbles 57 may remain in the enclosed space when an adhesive 40 is coated and the connection object 26 is joined to a connector 55A for a narrow pitch as shown in FIG. 15. The remaining air bubbles 57 may be swollen and contracted by an environmental changes (temperature changes), thereby producing an adverse influence on a connected condition. Even when air bubbles do not remain, incomplete discharge of the adhesive 40 may allow an internal pressure to remain in a groove 56A as shown in FIG. 16(A) and function to release bonding after the adhesive is hardened. Accordingly, the internal pressure may degrade bonding of an electrically conductive particle 38 to two terminal electrodes 24 and 28 as shown in FIG. 16(B). The length of the groove 56A which is shorter than the connection range L as described above poses a problem that the connection is made incomplete under an influence due to the air bubbles 57 or the internal pressure.

When the length of the groove 56 is set longer than the connection range L, in contrast, a space enclosed by a connection object 26 and the connector 55 for a narrow pitch does not constitute an enclosed space as shown in FIGS. 17(a) and 17(b), whereby air bubbles can hardly be involved and an excessive amount of the adhesive 40 is extruded without fail. Accordingly, an adverse influence is hardly produced by remaining air. Since the excessive amount of the adhesive 40 is extruded and an internal pressure does not remain, bonding between terminals is strengthened owing to cure shrinkage which takes place as shown in FIG. 18(A) when the adhesive 40 is hardened. When an electrically conductive particle 38 exists in a joined portion, the particle 38 functions to better the bonding with the terminal electrodes 24 and 28, thereby ensuring electrical connection as shown in FIG. 18(B).

Embodiment 6

FIGS. 19(A) and 19(B) are diagrams descriptive of a configuration of an electrostatic actuator 59 preferred as a sixth embodiment of the present invention.

The electrostatic actuator 59 shown in FIGS. 19(A) and 19(B) is an actuator which is configured for use in an ink head of an ink jet printer and has a micro structure formed by micro working according to the micro machining technology.

In the sixth embodiment, an ink jet head consists of an ink jet head main unit 60 and a connector unit 88 for external wiring which are manufactured separately and connected to each other.

The ink jet head main unit 60 has a three-layer structure composed by laminating a silicon substrate 70, an upper side nozzle plate 72 which is made also of silicon and a lower side glass substrate 74 which is made of borosilicate glass as shown in FIG. 19(A).

Disposed in the middle silicon substrate 70 are five independent ink chambers 76, a common ink chamber 78 which connects the five ink chambers 76 and a groove which functions as an ink supply path 80 communicating with the common ink chamber 78 and the ink chambers 76.

The groove is closed with a nozzle plate 72, thereby partitioning and forming the ink chambers 76 and the supply paths 80.

Furthermore, five independent concavities are formed on a rear side of the silicon substrate 70 at locations corresponding to the ink chambers 76 and closed with the glass substrate 74, thereby forming an oscillation chamber 71 having a height indicated by a size q in FIG. 19(A). Partition walls of the ink chambers 76 and the oscillation chamber 71 of the silicon substrate 70 are configured as oscillating plates 66 which function as elastically deformable oscillators.

Nozzles 62 are formed in the nozzle plate 72 at locations corresponding to tips of the ink chambers 76 and communicating with the ink chambers 76.

The grooves disposed in the silicon substrate 70 and the nozzles 62 disposed in the nozzle plate 72 are formed using the micro working technique according to the micro machining technology.

Opposed electrodes 90 which are opposed to each other are disposed on the oscillating plates 66 and the glass substrate 74.

Fine gaps formed between the silicon substrate 70 and the opposed electrodes 90 are sealed with sealing members 84.

Furthermore, the opposed electrodes 90 on the glass substrate 74 are pulled out on a left side in FIGS. 19(A) and 19(B) to form terminal electrode 86. A connector 88 for a narrow pitch which is manufactured separately is connected to the terminal electrodes 86, thereby composing the ink jet head having a connector section.

The plurality of ink jet head main units 60 which have the configuration described above are manufactured in a condition of a wafer and cut out along dicing lines. After dicing, the ink jet head main unit 60 is connected to the connector 88 for a narrow pitch which is manufactured separately.

Description will be made of operations of the ink jet head main unit 60 which is configured as described above.

Ink is supplied to the common ink chamber 78 from an ink tank (not shown) by way of an ink supply port 82. The ink which is supplied into the common ink chamber 78 is supplied into the ink chambers 76 by way of the ink supply path 80. When a voltage is applied across the opposed electrodes in this condition, the oscillating plate 66 is electrostatically attracted toward the glass substrate 74 and oscillated by an electrostatic force produced between the opposed electrodes. An ink drop 61 is ejected from the nozzle 62 due to an internal pressure change in the ink chamber 76 which is caused by oscillation of the oscillating plate 66.

Since the sixth embodiment is configured to manufacture the ink jet head main unit 60 and the connector 88 for a narrow pitch separately and join these members to each other, the sixth embodiment provides an effect which will be described below.

The ink jet head main unit 60 is manufactured by laminating the glass substrate 74, the silicon substrate 70 and the nozzle plate 72 in a condition of a wafer as described above. The terminal electrodes 86 are formed on the glass substrate 74 for external electrical connection, and extended outward from the silicon substrate 70 and the nozzle plate 72. Accordingly, the wafer on which the silicon substrate 70 or the nozzle plate 72 is disposed at a location opposed to the terminal electrodes 86 is not utilized at a laminating step.

If it is assumed that the ink jet head main unit 60 itself can be electrically connected to an external substrate, it will be necessary to dispose terminal electrodes at a wide pitch on the glass substrate 74 so as to permit external wiring, whereby the terminal electrodes 86 will be rather large. When the large terminal electrodes 86 are formed on the glass substrate 74, the wafer on which the silicon substrate 70 or the nozzle plate 72 is formed at the location opposed to the terminal electrodes 86 is not utilized, thereby wasting the wafer having a large area. Moreover, highly pure and expensive silicon crystal plates must be used to form the oscillating plates 66 which are remarkably thin (approximately 1 μm) on the silicon substrate 70. A manufacturing cost of a product is largely influenced by wasting the expensive silicon crystal plates.

In contrast, the sixth embodiment permits configuring a terminal portion of the ink jet head main unit 60 compact, thereby not wasting expensive silicon crystal plates. Moreover, the sixth embodiment makes it possible to lower a manufacturing cost of an apparatus as a whole since a silicon crystal plate used to form the connector 88 for a narrow pitch does not need to have a purity so high as that of silicon crystal plates used to form the oscillating plates 66.

Embodiment 7

FIG. 20 is a diagram descriptive of a piezoelectric actuator preferred as a seventh embodiment. A piezoelectric actuator 91 comprises a piezoelectric oscillator 93 which has external electrodes 93a and 93b formed on both sides, and a holding member 95 which holds the piezoelectric oscillator 93. A protruding portion 97 is formed on the holding member 95 and the piezoelectric oscillator 93 is joined to the holding member 95 at a joining area A of the protruding portion 97. The external electrodes 93a and 93b (portions traced in thick lines in the figure) of the piezoelectric oscillator 93 extend from both side surfaces to middles locations of first surfaces 93c respectively. Electrodes 95a and 95b which are formed on the holding member 95 and traced in thick lines also extend from both outside edges to a middle of the protruding portion 97. The piezoelectric oscillator 93 is rigidly joined to the holding member 95 at the joining area A set on the, protruding portion 97, and the external electrodes 93a and 93b of the piezoelectric oscillator 93 are connected and made conductive to the electrodes 95a and 95b of the holding member. Furthermore, a connector 20 for a narrow pitch is connected to the electrodes 95a and 95b of the holding member 95 so that an external signal is input into the piezoelectric actuator 91 from outside by way of the connector 20 for a narrow pitch.

By disposing the connector 20 for a narrow pitch separately as described above, it is possible to configure a terminal electrode section so as to occupy a minimum area in the piezoelectric actuator 91, configure the piezoelectric actuator 91 itself compact and manufacture the large number of piezoelectric actuators 91 from a single wafer, thereby lowering a manufacturing cost.

Embodiment 8

FIG. 21 is a conceptional diagram showing an ink jet head 98 which uses the piezoelectric actuator 91 shown in FIG. 20. A nozzle plate 108 having a nozzle 101 is joined to a tip of an ink flow path 99 which is composed of a flow path forming member 103 and an oscillating plate 105, and an ink supply path 108 is disposed at an end on an opposite side. The piezoelectric actuator 91 is disposed so that a mechanical function surface 93d is kept in contact with an oscillating plate 95 and opposed to the ink flow path 99. The external electrodes 93a and 93b on both the sides of the piezoelectric oscillator 93 are connected to the electrodes 95a and 95b of the holding member, and external signals are input into the piezoelectric actuator 91 by way of the electrodes 95a and 95b of the holding member 95 as well as the connector 20 for a narrow pitch.

When ink is charged into the ink flow path 99 (to a tip of the nozzle 101) and the above described piezoelectric actuator 91 is driven in this configuration, the mechanical function surface 93d causes swelling deformation and deflecting deformation at the same time with a high efficiency, thereby gaining a very large effective displacement in a vertical direction in FIG. 21. Due to this deformation, the oscillating plate 95 is deformed in correspondence with the mechanical function surface 93d as indicated by dotted lines in FIG. 21, thereby producing a large pressure change (volume change) in the ink flow path 99. This pressure change causes ink ejection from the nozzle 101 in a direction indicated by an arrow in FIG. 21 and the ink ejection is remarkably efficient since the pressure change is remarkably efficient.

When the connector 20 for a narrow pitch is disposed separately as described above, it is possible to configure wiring terminals so as to occupy a minimum area in the piezoelectric actuator 91, thereby configuring the ink jet head 98 itself compact.

Embodiment 9

The ink jet head 98 preferred as the eighth embodiment described above is used in a condition where it is mounted on a carriage 111 as shown in FIG. 22. The carriage 111 is movably mounted on a guide rail 113 and a location of the carriage 111 is controlled in a direction of width of paper 117 which is fed out by a roller 115. A mechanism shown in FIG. 22 is disposed in an ink jet printer 119 shown in FIG. 23. The ink jet head 98 can be used as a line head of a line printer. In such a case, the carriage 111 is unnecessary.

Though above description has been made of an example where the ink jet head 98 is of a type which ejects an ink drop in a direction toward an edge using the piezoelectric actuator 91 and the ink jet printer uses this ink jet head, an ink jet printer may have a similar configuration when the ink jet printer uses an ink jet head 60 of a type which ejects an ink drop from a side of a face surface using the electrostatic actuator mentioned in the seventh embodiment described above.

Embodiment 10

FIGS. 24(A) and 24(B) show a micro pump as an example of a micro machine preferred as a tenth embodiment: FIG. 24(A) being a top view of the micro machine and FIG. 24(B) being sectional view of the micro machine.

The micro pump has a configuration wherein a silicon substrate 121 worked by a micro machining working method is sandwiched between two glass plates 122 and 123, and functions to suck a fluid from a suction side pipe 124 and eject the fluid into an ejection side pipe 125.

The micro pump operates on a principle that it changes a pressure in a pressure chamber 128 by applying a voltage to a piezoelectric element 127 bonded to a diaphragm 126 formed at a center location of the silicon substrate 121 and deflecting the diaphragm, and opens and closes a suction valve 132 and an ejection valve 133 by displacing a suction side diaphragm 129 and an ejection side diaphragm 131 which are spatially continuous to the pressure chamber 128, thereby feeding the fluid under pressure from the suction side pipe 124 into the ejection side pipe 125. In FIG. 24(B), the pressure chamber 128 is spatially continuous to a space over the suction side diaphragm 129 and a space under the ejection side diaphragm 131.

In the tenth embodiment also, wiring is made to an outside by way of the connector for a narrow pitch according to the present invention as in the sixth through eighth embodiments described above. By disposing the connector for a narrow pitch separately as described above, it is possible to configure the micro pump itself compact.

Embodiment 11

FIG. 25 is an exploded perspective view showing main parts of a light modulator preferred as another embodiment of the present invention.

The light modulator is configured mainly by a silicon substrate 140, a glass substrate 150 and a cover substrate 170.

The silicon substrate 140 has a plurality of fine mirrors 141 which are arranged on a matrix. Out of the plurality of fine mirrors 141, fine mirrors 141 which are arranged in a direction, for example an X direction in FIG. 25, are connected with torsion bars 143. Furthermore, a frame like member 145 is disposed so as to surround a region at which the plurality of fine mirrors 141 are arranged. Connected to this frame like member 145 are ends of the plurality of torsion bars 143. Furthermore, slits are formed in the fine mirrors 141 around portions connected to the torsion bars 143 to facilitate inclining drive of the torsion bars 143 in a direction around axial lines. Furthermore, reflecting layers 141a are formed on surfaces of the fine mirrors 141. When the fine mirrors are incliningly driven, a reflecting direction of rays incident on the fine mirrors 141 is changed. Light can be modulated by controlling a time period for which the rays are reflected in a predetermined direction. A circuit which incliningly drives the fine mirrors 141 is disposed on the glass substrate 150.

The glass substrate 150 has concavities 151 at a central region and a rising member 153 formed around the concavities. A portion of the rising member 153 is notched to form an electrode withdrawal port 155 and an electrode withdrawal plate portion 157 which is continuous to the concavities 151 is formed outside the electrode withdrawal port 155. The glass substrate 150 has a large number of support members 159 which are formed in the concavities 151 so as to protrude from the concavities 151 to a height of a ceiling of the rising member 153 at locations opposed to the torsion bars 143 between the two fine mirrors 141 adjacent to one another in the X direction. Furthermore, a wiring pattern 161 is formed on the concavities 151 and the electrode withdrawal plate portion 157 of the glass substrate 150. This wiring pattern 161 has first and second address electrodes 163 and 165 at locations opposed to rear surfaces of the fine mirrors 141 on both sides of the torsion bars 143. The first address electrodes 163 which are arranged in the Y direction are connected commonly to a first common wire 167. Similarly, the second address electrodes 165 which are arranged in the Y direction are connected commonly to a second common wire 169.

The silicon substrate 140 is anodically joined on the glass substrate 150 which has a configuration described above. At this time, both the ends of the torsion bars 143 and the frame like member 145 of the silicon substrate 140 are joined to the rising member 153 of the glass substrate 150. Furthermore, intermediate portions of the torsion bars 143 of the silicon substrate 140 are anodically joined to the support members 159 of the glass substrate 150, Thereafter, the cover substrate 170 is joined over the frame like member 145 of the silicon substrate 140. Both ends of each torsion bar 143 which are coupled with the frame like member 145 are diced at locations to be cut off the frame like member 145. Furthermore, a circumferential edge portion including the electrode withdrawal port 155 notched in the rising member 153 of the glass substrate 150 is sealed and enclosed with a sealing agent, thereby completing the light modulator.

The first common wire 167 and the second common wire 169 of the completed light modulator are connected to a flexible substrate such as a tape carrier package incorporated with a drive IC by way of the connector for a narrow pitch according to the present invention as in the sixth through eighth embodiments described above so that external signals are input into the light modulator.

By disposing the connector for a narrow pitch separately as described above, it is possible to configure a wiring terminal so as to occupy a minimum area on the glass substrate 150, thereby manufacturing the light modulator itself compact.

Embodiment 12

FIG. 26 is a diagram descriptive of an example of a liquid crystal panel preferred as a twelfth embodiment of the present invention in a condition of a module step after completing an array step and a cell step, that is, a condition before an electronic circuit and the like of a drive system is disposed so that a liquid crystal cell can be electrically controlled. Speaking concretely, a liquid crystal panel 180 has a liquid crystal cell 181, a connector 182 for a narrow pitch and a tape carrier package 184 incorporated with a drive IC 183.

The liquid crystal cell 181 is configured, for example, by two substrates 181a and 181b between which a liquid crystal material is injected and enclosed: pixel electrodes, a thin film transistor connected to the pixel electrodes, a source for the thin film transistor, a source line electrically connected to a gate, a data line and the like are formed on the substrate 181a (located upper in FIG. 26), whereas opposed electrodes, color filters and the like are disposed on the substrate 181b (located lower in FIG. 26). At the module step, terminal electrodes 185 formed on the liquid crystal cell 181 are overlapped with terminal electrodes 186 of the connector 182 for a narrow pitch or the terminal electrodes 185 are overlapped with the electrode terminals 186 at a narrow pitch with an electrically conductive member interposed, and connected to each other by pressurizing and heating.

Furthermore, terminals 187 disposed at an end of a wiring pattern which enlarges and extends from other ends of the terminal electrodes 186 at the narrow pitch of the connector 182 for a narrow pitch are connected to terminals 188 of the tape carrier package 184, thereby making the terminal electrodes 185 conductive to the drive IC 183.

When the connector 182 for a narrow pitch is disposed as described above, it is possible to minimize an area of the liquid crystal cell 181 to be occupied by the terminal electrodes 185. A large display section can therefore be reserved even with a liquid crystal cell which has an area remaining unchanged from a conventional area. Furthermore, the invention makes it possible to connect the terminal electrodes at a narrow pitch, thereby increasing the number of terminals in a connecting section. Accordingly, it is possible to arrange wires and pixels at narrow pitches with high precision.

Embodiment 13

FIG. 27 shows a portable telephone as an example of electronic appliance which utilizes the liquid crystal panel preferred as the twelfth embodiment.

The liquid crystal panel is used in a display member 191 of a portable telephone 190 shown in FIG. 27.

When pixels can be arranged at a narrow pitch with high precision in the liquid crystal panel by utilizing the connector for a narrow pitch, it is possible to obtain the portable telephone 190 equipped with the display member 191 which is compact and nevertheless provides high legibility.

What is claimed is:

1. A connector comprising:
    a substrate made of single crystal silicon and having edge portions;
    a plurality of closely spaced first terminal electrodes arranged on a surface of the substrate along an edge portion;
    a plurality of more widely spaced second terminal electrodes arranged on the surface along another edge portion; and
    connecting wires formed on the surface for electrically connecting the first terminal electrodes with the second terminal electrodes, respectively, characterized in that grooves cut in the surface are provided between the first terminal electrodes respectively, to prevent the first terminal electrodes from being shorted, and an insulating film is formed in said grooves.

2. The connector for terminals with a narrow pitch according to claim 1, characterized in that metal plates are formed on the insulating film formed in said grooves.

3. The connector for terminals with a narrow pitch according to claim 2, characterized in that the metal plates are connected to said substrate.

4. The connector for terminals with a narrow pitch according to claim 1, characterized in that said first terminal electrodes are closely spaced to correspond to external terminals with a narrow pitch formed in a device to be connected to the connector, and said grooves are formed for reserving a bonding agent used to connect said first terminal electrodes with said external terminals.

5. The connector for terminals with a narrow pitch according to claim 4, characterized in that a depth of said grooves is set not shallower than three times of a particle diameter of electrically conductive particles contained in said bonding agent.

6. The connector for terminals with a narrow pitch according to claims 4, characterized in that said connector has characteristic that a coefficient of thermal expansion of said substrate is nearly equal to or smaller than a coefficient of thermal expansion of said device to be connected.

7. The connector for terminals with a narrow pitch according to claim 6, characterized in that a crystal face of said single-crystal silicon is a lattice plane having miller indices of (110).

8. The connector for terminals with a narrow pitch according to claim 1, characterized in that said groove is set longer than an overlapped portion of the first terminal electrodes which is to be overlapped with the external terminals to connect each other.

9. The connector for terminals with a narrow pitch according to claim 1, characterized in that a crystal face of said single-crystal silicon is a lattice plane having miller indices of (100).

10. A micro machine, comprising a first substrate on which a moving mechanism portion and a plurality of external terminals with a narrow pitch are formed, characterized in that:
    said micro machine further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrodes respectively to prevent the terminal electrodes from being shorted; and
    the first terminal electrodes is spaced to correspond to the external terminals with narrow pitch on the first substrate, and connected to the external terminals.

11. A piezoelectric actuator comprising a first substrate on which a piezoelectric element and a plurality of external terminals with a narrow pitch are formed, characterized in that:

said actuator further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal respectively to prevent the terminal electrodes from being shorted electrodes; and the first terminal electrodes is spaced to correspond to the external terminals with narrow pitch on the first substrate, and connected to the external terminals.

12. An electrostatic actuator comprising a first substrate on which an electrostatic oscillator and a plurality of external terminals with a narrow pitch are formed, characterized in that:

said actuator further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrodes respectively to prevent the terminal electrodes from being shorted, and the first terminal electrodes is spaced to correspond to the external terminals with narrow pitch on the first substrate, and connected to the external terminals.

13. An ink jet head comprising a first substrate on which a piezoelectric element and a plurality of external terminals with a narrow pitch are formed, and functioning to eject an ink drop with said piezoelectric element, characterized in that:

said ink jet head further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrodes respectively to prevent the terminal electrodes from being shorted; and the first terminal electrodes is spaced to correspond to the external terminals with narrow pitch on the first substrate, and connected to the external terminals.

14. An ink jet head comprising a first substrate on which an electrostatic oscillator and a plurality of external terminals with a narrow pitch are formed, and functioning to eject an ink drop with said electrostatic oscillator, characterized in that:

said ink jet head further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrodes respectively to prevent the terminal electrodes from being shorted; and the first terminal electrodes is spaced to correspond to the external terminals with narrow pitch on the first substrate, and connected to the external terminals.

15. An inkjet printer comprising an inkjet head which comprises a first substrate on which a piezoelectric element and a plurality of external terminals with a narrow pitch are formed, characterized in that:

said ink jet head further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrodes respectively to prevent the terminal electrodes from being shorted; and the first terminal electrodes is spaced to correspond to the external terminals with narrow pitch on the first substrate, and connected to the external terminals.

16. An ink jet printer comprising an ink jet head which comprises a first substrate on which an electrostatic oscillator and a plurality of external terminals with a narrow pitch are formed, characterized in that:

said ink jet head, further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the, surface, for electrically connecting the first terminal electrodes with the,second terminal electrodes; and grooves cut in the surface between the first terminal electrodes respectively to prevent the terminal electrodes from being shorted; and the first terminal electrodes is spaced to correspond to the external terminals with narrow pitch on the first substrate, and connected to the external terminals.

17. A liquid crystal device comprising a liquid crystal sandwiched between a pair of a first substances of which a plurality of external terminals with a narrow pitch are formed on a surface, characterized in that:

said liquid crystal device further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrodes respectively to prevent the terminal electrodes from being shorted; and the first terminal electrodes is spaced to correspond to the external terminals with narrow pitch on the first substrate, and connected to the external terminals.

18. An electronic appliance comprising a liquid crystal device, characterized in that:

said liquid crystal device comprises a liquid crystal sandwiched between a pair of first substrates of which a plurality of external terminals with a narrow pitch are formed on a surface said liquid crystal device further comprises a second substrate having edge portions, said second substrate is provided with: a plurality of closely spaced first terminal electrodes arranged on a surface of the substrate along an edge portion; a plurality of more widely spaced second terminal electrodes arranged on the surface along another edge portion; connecting wires formed on the surface, for electrically connecting the first terminal electrodes with the second terminal electrodes; and grooves cut in the surface between the first terminal electrode respectively to prevent the terminal electrodes from being shorted, and the first terminal electrodes is spaced to correspond to the external terminals with narrow pitch on the first substrate, and connected to the external terminals.

* * * * *